(12) United States Patent
Jun et al.

(10) Patent No.: US 12,393,244 B2
(45) Date of Patent: Aug. 19, 2025

(54) SYSTEMS, METHODS, AND APPARATUS FOR PROVIDING POWER TO STORAGE DEVICES

(71) Applicant: Samsung Electronics Co., Ltd., Suwon-si (KR)

(72) Inventors: Sang Hun Jun, San Jose, CA (US); Yang Seok Ki, Palo Alto, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 18/128,194

(22) Filed: Mar. 29, 2023

(65) Prior Publication Data

US 2024/0201763 A1    Jun. 20, 2024

Related U.S. Application Data

(60) Provisional application No. 63/437,636, filed on Jan. 6, 2023, provisional application No. 63/434,087, filed on Dec. 20, 2022.

(51) Int. Cl.
 *G06F 1/00* (2006.01)
 *G06F 1/26* (2006.01)

(52) U.S. Cl.
 CPC .................. *G06F 1/266* (2013.01)

(58) Field of Classification Search
 CPC .......... G06F 1/266; G06F 1/189; G06F 1/263; G06F 13/1668; G06F 13/4022;
 (Continued)

(56) References Cited

U.S. PATENT DOCUMENTS 5,047,988 A    9/1991    Mizuta
5,640,357 A    6/1997    Kakimi
(Continued)

FOREIGN PATENT DOCUMENTS

CN    106959741 A    7/2017
EP    0437129 A2    7/1991
(Continued)

OTHER PUBLICATIONS

European Extended Search Report for Application No. 23214248.9, mailed Apr. 25, 2024.
(Continued)

*Primary Examiner* — Xuxing Chen
(74) *Attorney, Agent, or Firm* — Renaissance IP Law Group LLP

(57) ABSTRACT

An apparatus may include a storage structure including a power connection fabric, a first device interface configured to receive a first device having a form that may be compatible with a device form, and connect the first device to the power connection fabric, and a second device interface configured to receive a second device having a form that may be compatible with the device form, and connect the second device to the power connection fabric. The first device may include a storage device, and the second device may include a power device. The first device interface may include a connector to connect the storage device to the power connection fabric. The first device interface may include a device slot to receive the storage device. The second device interface may include a connector to connect the power device to the power connection fabric.

20 Claims, 27 Drawing Sheets

(58) Field of Classification Search
CPC ..... G06F 13/4068; G06F 1/187; G11C 5/143; G11C 5/14
See application file for complete search history.

(56) References Cited

U.S. PATENT DOCUMENTS

| | | | |
|---|---|---|---|
| 5,915,122 | A | 6/1999 | Tsurumi |
| 6,661,671 | B1* | 12/2003 | Franke ................. G06F 1/26 |
| | | | 361/752 |
| 7,089,435 | B2 | 8/2006 | Kawakubo |
| 7,254,742 | B2 | 8/2007 | Hayashi |
| 8,848,362 | B1* | 9/2014 | Che ..................... G05B 9/02 |
| | | | 702/132 |
| 8,868,957 | B2 | 10/2014 | Davis et al. |
| 9,047,075 | B1 | 6/2015 | Lee |
| 9,746,886 | B2* | 8/2017 | Davis ................. G06F 1/183 |
| 10,014,701 | B2 | 7/2018 | Toya |
| 10,379,591 | B2 | 8/2019 | Engler |
| 11,102,908 | B1* | 8/2021 | Komori ............... G06F 1/187 |
| 11,656,669 | B2* | 5/2023 | Olarig ................ G06F 3/0679 |
| | | | 714/24 |
| 2006/0136765 | A1 | 6/2006 | Poisner et al. |
| 2010/0299548 | A1 | 11/2010 | Chadirchi et al. |
| 2013/0282944 | A1* | 10/2013 | Shaw ................. G06F 1/186 |
| | | | 710/305 |
| 2016/0205804 | A1 | 7/2016 | Hartman |
| 2018/0026316 | A1 | 1/2018 | Teng et al. |
| 2021/0165581 | A1 | 6/2021 | Kwon |
| 2021/0318739 | A1 | 10/2021 | Wells et al. |
| 2022/0011945 | A1 | 1/2022 | Coleman et al. |
| 2022/0083257 | A1* | 3/2022 | Kachare ............... G06F 3/0655 |
| 2022/0155973 | A1 | 5/2022 | Lim et al. |
| 2022/0200331 | A1 | 6/2022 | Gao |
| 2022/0261055 | A1* | 8/2022 | Uchiyama ............. G06F 1/266 |
| 2022/0269326 | A1* | 8/2022 | Yang ................... G06F 13/4063 |
| 2023/0122961 | A1* | 4/2023 | Saigan ................ H05K 7/1487 |
| | | | 361/679.48 |
| 2023/0342290 | A1* | 10/2023 | Tumanova ............. G06F 3/061 |
| 2024/0134814 | A1* | 4/2024 | Alkalay ............. G06F 13/4022 |

FOREIGN PATENT DOCUMENTS

| | | |
|---|---|---|
| JP | H11265323 A | 9/1999 |
| WO | 2016048281 A1 | 3/2016 |

OTHER PUBLICATIONS

European Extended Search Report for Application No. 23214337.0, mailed Apr. 25, 2024.

Office Action for U.S. Appl. No. 18/128,201, mailed Jun. 4, 2025.

* cited by examiner

SYSTEMS, METHODS, AND APPARATUS FOR PROVIDING POWER TO STORAGE DEVICES

REFERENCE TO RELATED APPLICATIONS

This application claims priority to, and the benefit of, U.S. Provisional Patent Applications Ser. No. 63/434,087 filed Dec. 20, 2022, and Ser. No. 63/437,636 filed Jan. 6, 2023, both of which are incorporated by reference.

TECHNICAL FIELD

This disclosure relates generally to storage devices, and more specifically to systems, methods, and apparatus for providing power to storage devices.

BACKGROUND

Data processing systems may use different types of memory such as volatile memory (e.g., dynamic random access memory (DRAM)), nonvolatile memory (e.g., flash memory), and/or the like. Data processing systems may also use storage devices such as hard disk drives (HDDs), solid state drives (SSDs), and/or the like. Some data processing systems may use backup power, for example, to prevent data loss in the event of a power loss event.

The above information disclosed in this Background section is only for enhancement of understanding of the background of the inventive principles and therefore it may contain information that does not constitute prior art.

SUMMARY

An apparatus may include a storage structure including a power connection fabric, a first device interface configured to receive a first device having a form that may be compatible with a device form, and connect the first device to the power connection fabric, and a second device interface configured to receive a second device having a form that may be compatible with the device form, and connect the second device to the power connection fabric. The first device may include a storage device, and the second device may include a power device. The first device interface may include a connector to connect the storage device to the power connection fabric. The first device interface may include a device slot to receive the storage device. The second device interface may include a connector to connect the power device to the power connection fabric. The second device interface may include a device slot to receive the power device. The first device interface may be configured to receive the power device, and connect the power device to the power connection fabric. The first device interface may include a first connector to connect the storage device to the power connection fabric, and a second connector to connect the power device to the power connection fabric. The second device interface may include a third connector to connect the power device to the power connection fabric.

The second device interface may be configured to receive the storage device, and connect the storage device to the power connection fabric. The second device interface may include a first connector to connect the storage device to the power connection fabric, and a second connector to connect the power device to the power connection fabric. The first device interface may include a third connector to connect the storage device to the power connection fabric. The first device interface may be configured to receive the power device, and connect the power device to the power connection fabric. The first device interface may include a first connector to connect the storage device to the power connection fabric, and a second connector to connect the power device to the power connection fabric, and the second device interface may include a third connector to connect the storage device to the power connection fabric, and a fourth connector to connect the power device to the power connection fabric. The first connector may include a storage device connector, the second connector may include a power connector, the third connector may include a storage device connector, and the fourth connector may include a power connector. The storage structure may be configured to receive the power device using the second device interface and a third device interface having a form that may be compatible with the device form.

The power device may have a dimension that may be a multiple of a dimension of the device form. The multiple may be two. The multiple may be one-half. The storage structure may include a power control circuit to control, at least partially, a power transfer using the power connection fabric. The power transfer may include a power transfer from the second device interface to the first device interface. The power control circuit may be configured to control, at least partially, based on a power status, the power transfer from the second device interface to the first device interface. The power transfer may include a power transfer to the second device interface. The power control circuit may be configured to control, at least partially, using the power transfer to the second device interface, a charging of a power device connected to the second device interface. The power control circuit may be configured to monitor a charge state of a power device connected to the second device interface. The power control circuit may be configured to send information about a charge state of a power device connected to the second device interface. The power connection fabric may include a first connection connected to the power control circuit and a first connector of the first device interface, and a second connection connected to the power control circuit and a second connector of the second device interface.

The first connection may be connected to a third connector of a third device interface, wherein the third device interface may be configured to receive a device having a form that may be compatible with the device form. The second connection may be connected to a third connector of a third device interface, wherein the third device interface may be configured to receive a device having a form that may be compatible with the device form. The first connection may be connected to a fourth connector of a fourth device interface, wherein the fourth device interface may be configured to receive a device having a form that may be compatible with the device form. The first connector may include a storage device connector, the second connector may include a power connector, the third connector may include a power connector, and the fourth connector may include a storage device connector. The power connection fabric may include a third connection connected to the power control circuit and a power source. The storage structure may include a connection board, and the power connection fabric may be located, at least partially, on the connection board.

An apparatus may include a power device including an interface to connect the power device to a storage system, and a power source to provide to a storage device, wherein at least a portion of the power device may have a storage device form. The power device may be configured to provide power to the storage device using the interface. The interface may be a first interface, and the power device may include a second interface configured to provide power to the storage device. The second interface may include a connector.

A method may include performing, using a power connection fabric, a power transfer from a first device interface of a storage structure to a second device interface of the storage structure, wherein the first device interface may be configured to receive a first device having a form that may be compatible with a device form, and connect the first device to the power connection fabric, and the second device interface may be configured to receive a second device having a form that may be compatible with the device form, and connect the second device to the power connection fabric. The first device may include a power device, and the second device may include a storage device. The method may further include connecting, using the first device interface, the power device to the power connection fabric. The method may further include connecting, using the second device interface, the storage device to the power connection fabric. The method may further include controlling, by the storage structure, the power transfer.

An apparatus may include a storage device including an interface to connect the storage device to a storage system, and a power control circuit configured to control a power transfer to the storage device. The power control circuit may be configured to control a power transfer to a power device. The power control circuit may be configured to monitor a charge state of a power device. The power control circuit may be configured to send information about a charge state of a power device. The storage device may be configured to perform, at least partially, the power transfer to the storage device. The interface may include a connector. The connector may include a storage device connector. The interface may be a first interface, and the storage device may further include a second interface configured to perform, at least partially, the power transfer to the storage device. The power control circuit may be configured to control, using the second interface, a power transfer to a power device. The power control circuit may be configured to monitor, using the second interface, a charge state of the power device. The power control circuit may be configured to send, using the first interface, information about the charge state of the power device. The power control circuit may be configured to send, using the second interface, information about the charge state of the power device. The first interface may include a first connector, and the second interface may include a second connector. The first connector may include a storage device connector, and the second connector may include a power connector.

An apparatus may include a power device including an interface to connect the power device to a storage system, a power source, and a power control circuit configured to control, at least partially, a power transfer from the power source to a storage device, wherein at least a portion of the power device may have a storage device form. The power control circuit may be configured to control a power transfer to the power source. The power control circuit may be configured to monitor a charge state of the power source. The power control circuit may be configured to send information about a charge state of the power source. The power device may be configured to perform, at least partially, using the interface, the power transfer from the power source to the storage device. The interface may include a connector. The interface may be a first interface, and the power device may include a second interface configured to perform, at least partially, the power transfer from the power source to the storage device. The power control circuit may be configured to control, using the second interface, the power transfer from the power source to the storage device.

A method may include performing, at a storage structure, a power transfer with a storage device and a power device, and controlling, at least partially, by a power control circuit, the power transfer, wherein the storage structure may include a power connection fabric, a first device interface configured to receive the storage device, wherein the storage device has a form that may be compatible with a device form, and connect the storage device to the power connection fabric, and a second device interface configured to receive the power device, wherein the power device has a form that may be compatible with the device form, wherein the power control circuit may be located, at least partially, at the storage device or the power device. The power control circuit may be configured to monitor a charge state of the power device. The power control circuit may be configured to send information about a charge state of the power device. The power control circuit may be located, at least partially, at the storage device. The power transfer may be performed, at least partially, using a connection, and the connection may be connected to the storage device and the power device.

The storage device may include a first connector, and the power device may include a second connector connected to the first connector to perform, at least partially, the power transfer. The storage device may include a third connector configured to connect the storage device to the power connection fabric using the first device interface. The power transfer may include a power transfer to the power device. The power transfer may include a power transfer from the power connection fabric. The power transfer may include a power transfer from the storage device. The power control circuit may be configured to control the power transfer to the power device. The power transfer may include a power transfer from the power device to the storage device, and the power control circuit may be configured to control the power transfer from the power device to the storage device. The power control circuit may be located, at least partially, at the power device. The second device interface may be configured to connect the power device to the power connection fabric, and the power transfer may be performed, at least partially, using the power connection fabric. The power control circuit may be configured to control, at least partially, the power transfer. The power transfer may include a power transfer to the power device. The power transfer may include a power transfer to the storage device. The power transfer may include a power transfer from the power device.

BRIEF DESCRIPTION OF THE DRAWINGS

The figures are not necessarily drawn to scale and elements of similar structures or functions may generally be represented by like reference numerals or portions thereof for illustrative purposes throughout the figures. The figures are only intended to facilitate the description of the various embodiments described herein. The figures do not describe every aspect of the teachings disclosed herein and do not limit the scope of the claims. To prevent the drawings from becoming obscured, not all of the components, connections, and the like may be shown, and not all of the components may have reference numbers. However, patterns of component configurations may be readily apparent from the drawings. The accompanying drawings, together with the specification, illustrate example embodiments of the present disclosure, and, together with the description, serve to explain the principles of the present disclosure.

DETAILED DESCRIPTION

Figure 1:
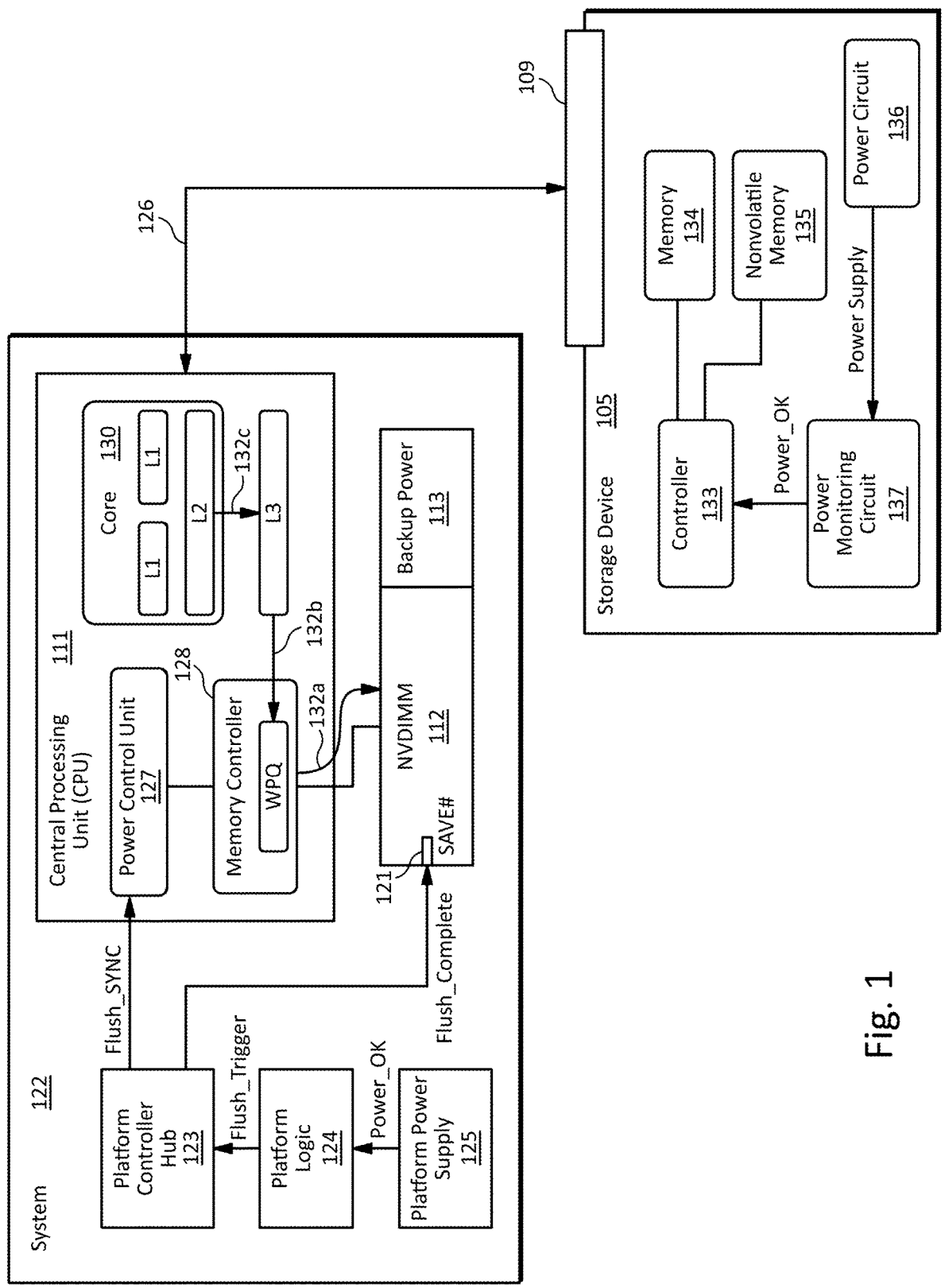
FIG. 1 illustrates an embodiment of a scheme for flushing data to a nonvolatile memory module in accordance with example embodiments of the disclosure.

A data processing system may use persistent memory to retain data in the event of power loss. Persistent memory may be implemented, for example, with a non-volatile dual inline memory module (NVDIMM) which may include both volatile memory such as dynamic random access memory (DRAM) and nonvolatile memory such as flash memory. The NVDIMM may use the DRAM for normal operations. If a loss of power is detected, data stored in the DRAM may be transferred to the flash memory to prevent data loss. Power from a backup power source such as a battery or supercapacitor may be provided to the NVDIMM to enable the NVDIMM to transfer the data to the flash memory.

In some embodiments, however, it may be difficult to access an NVDIMM and/or backup power source for service, repair, replacement, and/or the like. For example, in a storage server, one or more NVDIMMs and/or a backup battery may be located in a rear portion of a chassis, e.g., behind a midplane that may be used to connect storage devices to the server. Thus, accessing the NVDIMMs and/or backup battery may involve removing the server chassis from a rack, opening an enclosure of the chassis, and/or the like. Moreover, in some embodiments, it may be difficult to change (e.g., expand) the capacity of the NVDIMMs and/or battery, for example, to provide additional persistent memory capacity and/or additional backup power capacity.

Some systems, methods, and/or apparatus in accordance with example embodiments of the disclosure may involve the use of a power device that may be installed and/or removed in a manner similar to a storage device. For example, in some embodiments, a storage server may include a chassis having a first device interface configured to receive a storage device and a second device interface configured to receive a power device. A connection fabric (which may be located, for example, on a midplane) may be configured to transfer power between the power device and the storage device. Depending on the implementation details, this may enable the power device to provide backup power (e.g., using one or more batteries, supercapacitors, and/or the like) to the storage device while remaining relatively easy to access. Depending on the implementation details, this may facilitate the use of a storage device for persistent memory.

For example, in some embodiments, a storage server may include one or more device slots with openings oriented to the front of a chassis. This may enable a storage device to be connected to a midplane by inserting the storage device into a device slot without removing the chassis from a rack and/or without opening an enclosure of the chassis. A power device in accordance with example embodiments of the disclosure may be implemented with a form factor that may be compatible with a storage device. Thus, the power device may be inserted into one or more device slots which may be relatively easy to access. The power device may provide backup power to the storage device using a power control circuit and/or a connection fabric that may be located, for example, on the midplane.

In some embodiments, implementing a power device with a form factor that is compatible with a storage device may provide a flexible framework to service, repair, replace, expand, configure, and/or the like, power devices, storage devices, and/or other devices that may be installed in an accessible chassis slot. For example, in some embodiments, one or more power devices may be implemented with dimensions that may be a multiple of a slot width (e.g., double slot width, triple slot with, half slot width, and/or the like) which, depending on the implementation details, may provide different power capacities. As another example, in some embodiments, different slots in a chassis may be configured to receive different types of devices. For instance, some slots may be configured to receive storage devices, some slots may be configured to receive power devices, and some slots may be configured to receive either storage devices or power devices.

Some embodiments may include a connection fabric that may transfer power between one or more power devices, one or more storage devices, and/or the like. For example, a connection fabric may be implemented with traces on a circuit board (e.g., a midplane, backplane, and/or the like) wires, cables, connectors, jumpers, switches, regulators, and/or the like.

Some embodiments may include a power control circuit that may control, at least partially, power transfer between one or more power devices, storage devices, and/or the like. In some embodiments, a power control circuit may implement any number of features such as: providing and/or controlling power flow from one or more power devices to one or more storage devices (e.g., based on a power loss event); charging one or more power devices (e.g., from a main power source, from another device, and/or the like); monitoring one or more charge states of one or more power devices (e.g., to determine if a power device may supply sufficient power to a storage device); notifying a system, device, and/or the like, of one or more charge states of one or more power devices; and/or the like. In some embodiments, a power control circuit may be located at a system chassis (e.g., at a midplane), a storage device, a power device, at a combination thereof, are at any other location.

In some embodiments, a first device may be connected to a second device to provide power to the second device (e.g., without the power being transferred using a connection board). For example, a storage device may be installed in a first device slot, and a power device may be installed in an adjacent device slot. The power device may be connected to the storage device using one or more connectors, wires, cables, and/or the like to provide power to the storage device. In some such embodiments, a power control circuit may be included at least partially in the storage device, for example, to enable the power device to be charged through the storage device.

Although not limited to any specific applications, the inventive principles may facilitate the use of one or more storage devices, or one or more portions thereof, for persistent memory. For example, in some embodiments, a storage device may include volatile memory such as DRAM that may be mapped as system memory and/or used to receive data that may be flushed (e.g., copied) from other memory (e.g., central processing unit (CPU) cache) to the storage device. Operating a storage device for persistent memory, however, may involve the use of backup power, for example, to enable the storage device to flush data from volatile memory to storage media (e.g., flash memory) based on a power loss event to prevent data loss. Implementing a power device with a form factor that is compatible with a storage device may enable the power device to provide backup power to the storage device to facilitate using the storage device for persistent memory.

This disclosure encompasses numerous inventive principles relating to providing power to storage devices. The principles disclosed herein may have independent utility and may be embodied individually, and not every embodiment may utilize every principle. Moreover, the principles may also be embodied in various combinations, some of which may amplify some benefits of the individual principles in a synergistic manner.

For purposes of illustration, some embodiments may be described in the context of specific implementation details. The inventive principles, however, are not limited to these or any other implementation details. For example, some embodiments may be described in the context of storage systems in which a storage server may include a chassis (e.g., a rack-mount chassis) having one or more device slots oriented to accept storage devices, power, devices, and/or the like. The inventive principles, however, may be applied to any systems, methods, and/or apparatus in which power devices may be implemented with a form factor that may be compatible with other devices such as storage devices.

FIG. 1 illustrates an embodiment of a scheme for flushing data to a nonvolatile memory module in accordance with example embodiments of the disclosure. In the embodiment illustrated in FIG. 1, a system 122 (which may be implemented, for example, with a motherboard such as the motherboard 306 illustrated in FIG. 3) may include a CPU 111, an NVDIMM 112, a backup power module 113, a platform controller hub (PCH) 123, platform logic 124, and/or a platform power supply 125. A storage device 105 may be connected to the system 122 and/or CPU 111 using an interconnect (e.g., Peripheral Component Interconnect Express (PCIe)) 126 and/or a connector 109.

The CPU 111 may include a power control unit (PCU) 127, a memory controller 128 (which may include a write pending queue (WPQ), one or more CPU cores 130 (which may include one or more level 1 caches (L1) and/or one or more level 2 caches (L2)), and/or a level 3 cache (L3).

The platform power supply 125 may provide operating power to the system 122 and/or storage device 105, for example, under normal operating conditions. The platform power supply 125 may assert a power status signal (e.g., PWR_OK) to indicate that the platform power supply 125 may provide adequate power to operate the system 122 and/or storage device 105.

The platform logic 124 may monitor the power status signal and generate a trigger signal (e.g., Flush_Trigger) based, for example, on a de-assertion of the power status signal from the platform power supply 125. In response to a generation of the trigger signal, the platform controller hub 123 may transmit a flush synchronization (e.g., Flush_SYNC) signal to the CPU 111. The SYNC signal may cause the CPU 111 to flush data from one or more locations (e.g., one or more of the L1, L2, and/or L3 caches, and/or the WPQ) to the NVDIMM 112 (e.g., to volatile memory within the NVDIMM 112) as shown by arrows 132*a*, 132*b*, and/or 132*c*. Depending on the implementation details, after de-asserting the power status signal, the platform power supply 125 may continue providing power to operate the system 122 long enough to enable the CPU 111 to flush the data from the one or more locations to the NVDIMM 112.

In some embodiments, the platform controller hub 123 may transmit a flush complete signal (Flush_Complete) to the NVDIMM 112, for example, based on receiving an indication from the CPU 111 that the CPU 111 has completed flushing the data from the one or more locations to volatile memory (e.g., DRAM) in the NVDIMM 112. This may cause the NVDIMM 112 to control (e.g., delay) flushing data from its own volatile memory to nonvolatile memory within the NVDIMM 112. Depending on the implementation details, this may prevent loss of the data flushed from the CPU and/or other locations in the system that may flush data to volatile memory in the NVDIMM 112. For example, if the NVDIMM 112 begins flushing data from its volatile memory to its nonvolatile memory before the CPU 111 has completed flushing data to volatile memory in the NVDIMM 112, data received from the CPU 111 at a specific volatile memory location in the NVDIMM 112 after the specific volatile memory location has been flushed to nonvolatile memory within the NVDIMM 112 may be lost. The NVDIMM 112 may receive the flush complete signal, for example, using a pin (e.g., SAVE #) 121 of a card edge connector.

The storage device 105 may include a controller 133, volatile memory (e.g., DRAM) 134, storage media (e.g., nonvolatile memory such as flash memory) 135, one or more power circuits 136, and/or power monitoring logic 137. The one or more power circuits 136 may provide power to the storage device 105, for example, that it may receive through the storage device connector 109 (e.g., from the platform power supply 125). Additionally, or alternatively, the one or more power circuits 136 may provide power to the storage device 105 from an internal power source such as one or more batteries, supercapacitors (supercaps), tantalum capacitors, and/or the like.

During normal operation, the volatile memory 134 may be used for one or more buffers, caches, queues, and/or the like, and the storage device may operate using power received through the storage device connector 109 (e.g., from the platform power supply 125). The power monitoring circuit 137 may monitor the power used by the storage device 105 and assert a power status signal (e.g., PWR_OK) to the controller 133, for example, based on receiving adequate power through the storage device connector 109. In the event of a power loss (e.g., a failure of the platform power supply 125), the power monitoring circuit 137 may de-assert the power status signal which may cause the controller 133 to execute an internal flush operation in which data stored in the volatile memory 134 may be preserved by flushing (e.g., copying) the data to the storage media 135. During an internal flush operation, the one or more power circuits 136 may provide backup power to the storage device 105, for example, from one or more batteries, supercapacitors, tantalum capacitors, and/or the like.

For purposes of illustration, the embodiment illustrated in FIG. 1 includes some specific components, configurations, and/or the like, but other embodiments may include different components and/or configurations including different types and/or numbers of components, configurations, arrangements, connections, operations, and/or the like.

Figure 2:
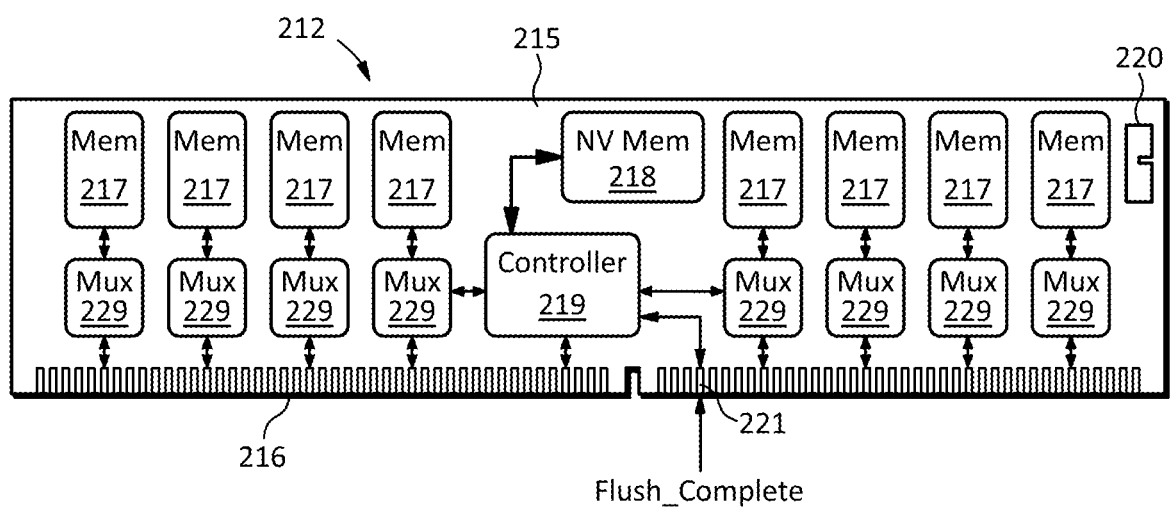
FIG. 2 illustrates an example embodiment of a nonvolatile memory module in accordance with example embodiments of the disclosure.

FIG. 2 illustrates an example embodiment of a nonvolatile memory module in accordance with example embodiments of the disclosure. The memory module 212 illustrated in FIG. 2 may be implemented as an NVDIMM and used, for example, as one of the NVDIMMs 112 and/or 312 illustrated in FIG. 1 and/or FIG. 3, respectively.

Referring to FIG. 2, the NVDIMM 212 may include a circuit board 215 having one or more card edge connectors 216 to install the NVDIMM 212 in a socket. The NVDIMM 212 may include one or more volatile memory (e.g., DRAM) devices 217, one or more multiplexers 229, one or more nonvolatile (e.g., flash) memory devices 218, and/or an NVDIMM controller 219. The NVDIMM 212 may also include a connector 220 to receive backup power, for example, through a cable connected to a backup power module such as the cable 314 and/or backup power module 313 illustrated in FIG. 3.

Depending on the implementation details, the backup power received through connector 220 may enable the NVDIMM controller 219 to reduce or prevent data loss by flushing (e.g., copying) data from volatile memory 217 to nonvolatile memory 218 based on a loss of power that may normally be received, for example, through the one or more card edge connectors 216. In some embodiments, the NVDIMM 212 may receive a flush complete (e.g., Flush_Complete) signal, for example, through a terminal pin 221 of a card edge connector 216. Depending on the implementation details, the NVDIMM controller 219 may control (e.g., delay) flushing data from volatile memory 217 to nonvolatile memory 218 based on the flush complete signal.

For example, in the embodiments illustrated in FIG. 1 and FIG. 2, an impending power loss event may cause the platform logic 124 to send a flush trigger signal to the platform controller hub 123 which may assert the flush synchronization signal to the CPU 111. Based on receiving the flush synchronization signal, the CPU 111 may begin flushing (e.g., copying) data from one or more of the L1, L2, and/or L3 caches, the WPQ, and/or the like, to volatile memory 217 in the NVDIMM 212. In some embodiments, the NVDIMM 212 may be notified of the impending power loss event (e.g., by receiving a flush trigger signal from the platform logic 124) and begin flushing data from volatile memory 217 to nonvolatile memory 218 in the NVDIMM 212. However, if the NVDIMM 212 begins flushing data from volatile memory 217 to nonvolatile memory 218 before the CPU 111 has completed flushing data from the one or more of the L1, L2, and/or L3 caches, the WPQ, and/or the like, to volatile memory 217 in the NVDIMM 212, data written by the CPU 111 to one or more specific memory locations in volatile memory 217 after those specific memory locations in volatile memory 217 have been flushed to nonvolatile memory 218 may be lost.

In the embodiments illustrated in FIG. 1 and FIG. 2, however, the NVDIMM 212 may delay flushing data from volatile memory 217 to nonvolatile memory 218 until the CPU 111 has completed flushing data from the one or more of the L1, L2, and/or L3 caches, the WPQ, and/or the like, to volatile memory 217 in the NVDIMM. The NVDIMM 212 may delay flushing data from volatile memory 217 to nonvolatile memory 218, for example, until the NVDIMM 212 receives the flush complete signal from the platform controller hub 123.

Figure 3:
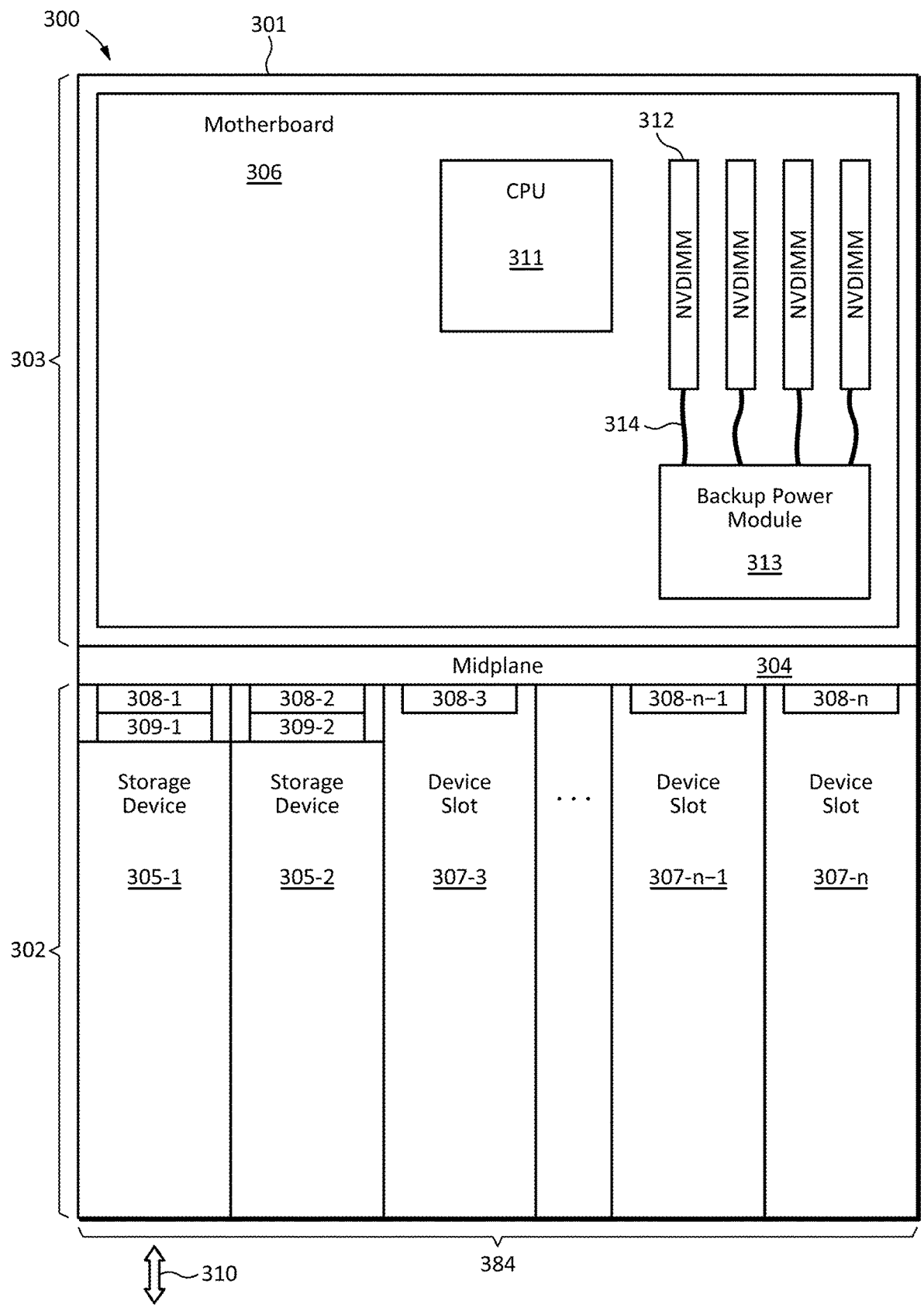
FIG. 3 illustrates an embodiment of a storage system in accordance with example embodiments of the disclosure.

FIG. 3 illustrates an embodiment of a storage system in accordance with example embodiments of the disclosure. The system illustrated in FIG. 3 may be implemented, for example, using one or more of the embodiments illustrated in FIG. 1 and/or FIG. 2.

The system illustrated in FIG. 3 may be implemented with a storage server 300 having a chassis 301 with a front portion 302 and a rear portion 303. A midplane 304, which may separate the front portion 302 from the rear portion 303, may connect one or more storage devices 305-1 through 305-*n* (which may be referred to individually and/or collectively as 305) to a motherboard 306 located in the rear portion 303 of the chassis 301. The storage devices 305 may have connectors 309-1 through 309-*n* (which may be referred to individually and/or collectively as 309) that may connect to corresponding connectors 308-1 through 308-*n* (which may be referred to individually and/or collectively as 308) on the midplane 304. Examples of the connectors 308 and/or 309 may include Serial ATA (SATA) connectors, Small Computer System Interface (SCSI) connectors, Serial Attached SCSI (SAS) connectors, M.2 connectors, EDSFF connectors (e.g., 1C, 2C, 4C, 4C+, and/or the like), U.2 connector (which may also be referred to as SSD form factor (SSF) SFF-8639 connectors), U.3 connectors, PCIe connectors, and/or the like.

The front portion 302 of the chassis 301 may include one or more slots 307-1 through 307-*n* (which may be referred to individually and/or collectively as 307) to receive the one or more storage devices 305. In FIG. 3, storage devices 305-1 and 305-2 are shown installed in slots 307-1 and 307-2, respectively, whereas slots 307-3 through 307-*n* are shown empty, but depending on the server configuration, any slot 307 may be empty or include a storage device 305.

In some embodiments, the chassis 301 may have a front opening 384 that may enable the one or more storage devices 305 to be installed in, and/or removed from, corresponding slots 307 as shown by arrow 310. Depending on the implementation details, the one or more slots may be accessible, for example, such that one or more of the storage devices 305 may be installed in, and/or removed from, one or more corresponding slots 307 without removing the chassis 301 from a rack in which it may be installed, without removing an access panel or otherwise opening an enclosure of the server 300, and/or the like.

The motherboard 306 may include a CPU 311, one or more NVDIMMs 312 installed in corresponding sockets on the motherboard 306. A backup power module 313 may provide backup power to the one or more NVDIMMs 312, for example, through one or more power cables 314, to enable the one or more NVDIMMs to operate as persistent memory. The backup power module 313 may be implemented with one or more batteries (e.g., a battery pack), one or more supercapacitors (e.g., a capacitor pack), and/or the like.

Some of the inventive principles of this disclosure relate to the use of one or more storage devices for persistent memory. Depending on the implementation details, using a storage device for persistent memory may provide one or more features and/or benefits. For example, in some embodiments, a storage device may provide greater capacity and/or lower cost than persistent memory implemented with other techniques such as NVDIMMs. As another example, in some embodiments, a storage device may provide improved performance (e.g., latency bandwidth, and/or the like), especially compared to persistent memory implemented with persistent media such as magnetoresistive random-access memory (MRAM), resistive random-access memory (Re-RAM), phase change memory (PCM), cross-gridded nonvolatile memory, memory with bulk resistance change, and/or the like. As a further example, in some embodiments, implementing persistent memory with a storage device may provide improved flexibility, accessibility, and/or the like, for servicing, repairing, replacing, expanding, reconfiguring, and/or the like, persistent memory. For instance, in some embodiments, a storage device used for persistent memory may be relatively easy to install in, and/or remove from, a slot at the front of a storage server chassis which may be relatively accessible as shown in FIG. 3. Thus, depending on the implementation details, a storage device used for persistent memory may be serviced, replaced, repaired, upgraded and/or the like, without removing a chassis from a rack and/or without opening an enclosure of a chassis.

In some embodiments, using a storage device for persistent memory may involve the use of a backup power source to prevent data loss, for example, by enabling the storage device to receive data that may be flushed to the storage device from other locations (e.g., CPU caches) and/or to perform an internal flush operation from internal volatile memory to storage media. In some embodiments, a backup power module for NVDIMMs such as the backup power module 313 illustrated in FIG. 3 may be used to provide backup power to a storage device configured as persistent memory. However, the backup power module 313 may not provide enough backup power capacity for one or more storage devices configured as persistent memory which, depending on the implementation details, may provide greater persistent memory capacity than one or more NVDIMMs. Moreover, it may be difficult to expand the capacity of the backup power module 313 and/or install and/or configure additional backup power modules to accommodate one or more storage devices configured as persistent memory. Additionally, the backup power module 313 may be difficult to service, repair, replace, expand, configure, and/or the like, because it may be located behind the midplane 304 and therefore may not be accessible from the front of the chassis 301. Thus, if the backup power module 313 is implemented with a battery pack, changing the batteries may involve removing the chassis from a rack and/or without opening an enclosure of the chassis.

In some embodiments, backup power for a storage device configured as persistent memory may be provided by an internal power source such as one or more supercapacitors within the storage device. However, an internal power source within a storage device may only have enough capacity to power the device while flushing normal internal operating data (e.g., caches, queues, and/or the like) from internal volatile memory to storage media. Thus, the internal power source may not have enough energy storage capacity to power the storage device while it flushes additional data that has been flushed to the storage device from other sources (e.g., CPU caches). Moreover, the internal power source may not have enough energy storage capacity to power the storage device while it waits to receive a flush complete signal from a system that may flush data to the storage device.

Some additional inventive principles of this disclosure include schemes to provide power (e.g., backup power) to a storage device. For example, in some embodiments, a power device used to provide backup power to a storage device configured as persistent memory may have a form that may enable it to be installed in, and/or removed from, a storage system in a manner similar to a storage device.

Figure 4A:
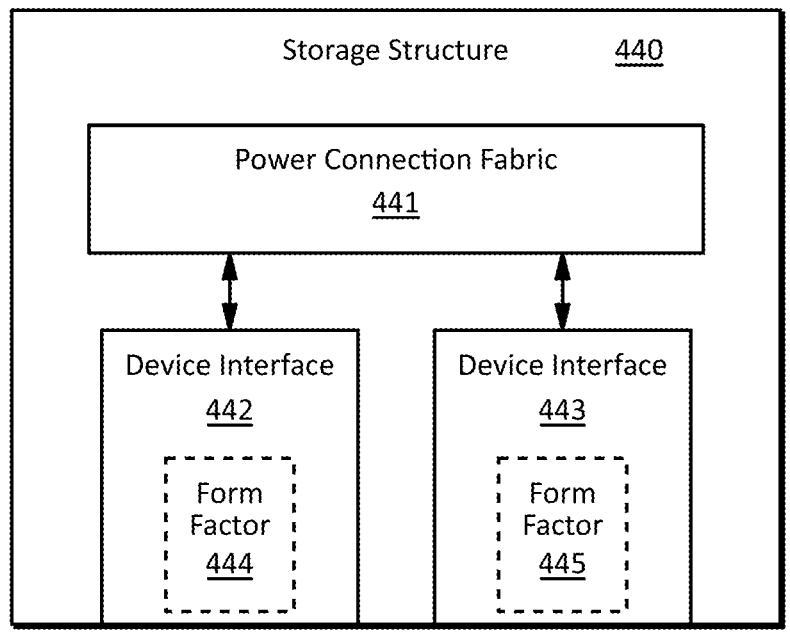
FIG. 4A illustrates a first embodiment of a scheme for providing power to a storage device in accordance with example embodiments of the disclosure.

FIG. 4A illustrates a first embodiment of a scheme for providing power to a storage device in accordance with example embodiments of the disclosure. In the embodiment illustrated in FIG. 4A, a storage structure 440 may include a power connection fabric 441, a first device interface 442, and/or a second device interface 443. The first device interface 442 may be configured to receive a first device having a first form factor 444 that is compatible with a device form factor (which may also be referred to as a device form). The first device interface 442 may also be configured to connect the first device to the power connection fabric 441. The second device interface 443 may be configured to receive a second device having a second form factor 445 that is compatible with the device form factor. The second device interface 443 may also be configured to connect the second device to the power connection fabric 441.

Depending on the implementation details, the embodiment illustrated in FIG. 4A may enable power to be transferred to, from, between, and/or the like, the first device interface 442, the second device interface 443 and/or any device or devices received by the device interfaces. For example, in some embodiments, the first device may be implemented as a storage device that may be received by the first device interface 442, and the second device may be implemented as a power device that may be received by the second device interface 443. In such an embodiment, the power connection fabric 441 may enable power from the power device to be transferred to the storage device, for example, as backup power.

The storage structure 440 may be implemented with any apparatus or combination of apparatuses such as a server (e.g., a compute server, a storage server, a database server, a network server, a cloud server, and/or the like), a node (e.g., a compute node, a storage node, a network node, and/or the like) a computer such as a workstation, a personal computer, a tablet, a smartphone, and/or the like, or multiples and/or combinations thereof.

The power connection fabric 441 may be implemented with any structures, components, and/or the like that may transfer power to, from, between, and/or the like, one or more devices. For example, in some embodiments, the power connection fabric 441 may be implemented, at least in part, with one or more traces on a circuit board such as a midplane, a backplane, and/or the like. As another example, in some embodiments, the power connection fabric 441 may be implemented, at least in part, with one or more cables, wires, transmission lines, and/or the like. As a further example, in some embodiments, the power connection fabric 441 may be implemented, at least in part, with one or more switches, power converters, regulators, capacitors, inductors, connectors, and/or the like.

In some embodiments, a device form factor may refer to one or more of a size, shape, footprint, dimension, configuration, arrangement, physical specification, and/or the like, or a combination thereof, of a device and/or apparatus to which the device may be installed, inserted, connected, attached, and/or the like. Additionally, or alternatively, in some embodiments, a device form factor may refer to any characteristic that may determine compatibility, interoperability, and/or the like of one or more devices and/or corresponding apparatus to which the device may be installed, inserted, connected, attached, and/or the like.

The device form factor with which the first form factor 444 and second form factor 445 may be compatible may be implemented with any device form factor such as a 3.5 inch storage device form factor, 2.5 inch storage device form factor, 1.8 inch storage device form factor, M.2 device form factor, Enterprise and Data Center Standard Form Factor (EDSFF) (which may include, for example, E1.S, E1.L, E3.S, E3.L, E3.S 2T, E3.L 2T, and/or the like), add-in card (AIC) (e.g., a PCIe card form factor including half-height (HH), half-length (HL), half-height, half-length (HHHL), and/or the like), Next-generation Small Form Factor (NG-SFF), NF1 form factor, compact flash (CF) form factor, secure digital (SD) card form factor, Personal Computer Memory Card International Association (PCMCIA) device form factor, and/or the like, or combination thereof.

The first device interface 442 and/or the second device interface 443 may be implemented with any structures, components, and/or the like, that may facilitate receiving the first and/or second devices and/or connecting the first and/or second devices to the power connection fabric 441. For example, a device interface may be implemented with a slot, a drive bay, a receptacle, and/or the like, that may accommodate, and/or be compatible with, a device having the first device form factor 444 and/or the second device form factor 445, either of both of which may be compatible with a common device form factor. For example, in some embodiments, the first device interface 442 and second device interface 443 may be implemented with drive bays (e.g., in a storage server chassis) that may accept 3.5 inch storage devices, 2.5 inch storage devices, EDSFF storage devices, M.2 storage devices, and/or the like.

The first device interface 442 and/or the second device interface 443 may include one or more connectors that may enable the first device and/or the second device to be connected to the power connection fabric 441. For example, in some embodiments, first device interface 442 and/or the second device interface 443 may include one or more storage device connectors (which may transport power, data, and/or the like for a storage device) such as one or more of an Integrated Drive Electronics (IDE) interface connector, an Extended IDE (EIDE) interface connector, a SATA connector, a SCSI connector, a SAS connector, an M.2 connector, an EDSFF connector (e.g., 1C, 2C, 4C, 4C+, and/or the like), a U.2 connector, a U.3 connector, a PCIe connector, and/or the like.

As another example, in some embodiments, the first device interface 442 and/or the second device interface 443 may include one or more power connectors such as one or more of an IDE power connector, a SATA power connector, and/or the like.

As a further example, in some embodiments, the first device interface 442 and/or the second device interface 443 may include one or more connectors that may support one or more of multiple functions (e.g., transporting power, data, and/or the like) such as a universal serial bus (USB) connector (e.g., USB-A, USB-B, USB-C, and/or USB mini, of any generation (e.g., 1.0, 2.0, 3.0, 3.1, 3.2) which, in some embodiments, may be configured as a power connector, a data connector, and/or a combination thereof, an RJ-45 connector (e.g., an Ethernet connector that may transport network signals, power (e.g., power over Ethernet (POE), and/or the like) and/or a combination thereof, a FibreChannel connector, an InfiniBand connector, and/or the like.

In some embodiments, one or more storage device connectors and/or power connectors may be used interchangeably. For example, in some embodiments, a storage device connector may be used to transfer power to and/or from a power device, and/or a power connector may be used to transfer data to and/or from a storage device.

Figure 4B:
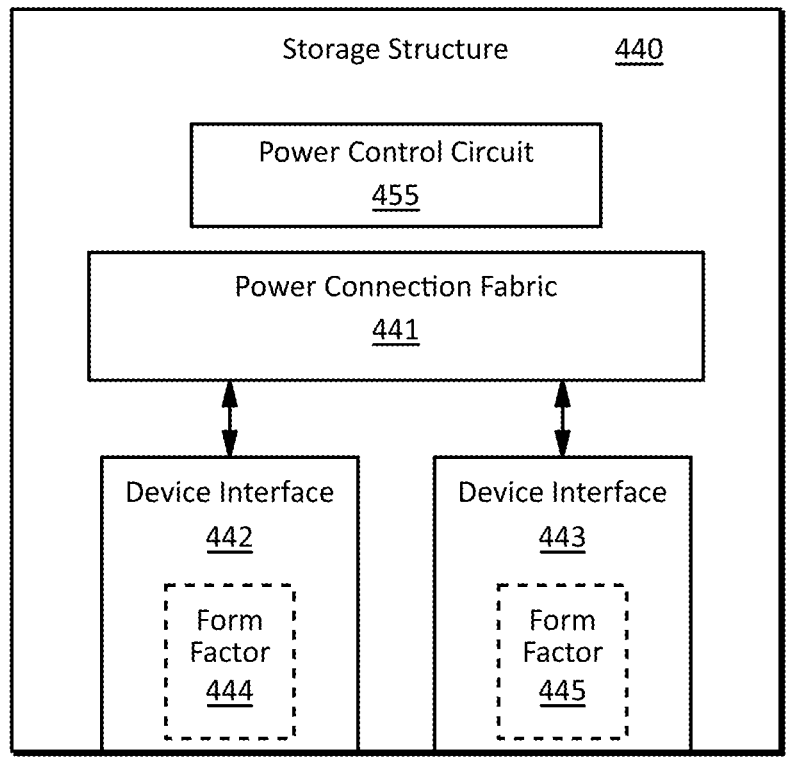
FIG. 4B illustrates a second embodiment of a scheme for providing power to a storage device in accordance with example embodiments of the disclosure.

FIG. 4B illustrates a second embodiment of a scheme for providing power to a storage device in accordance with example embodiments of the disclosure. The embodiment illustrated in FIG. 4B may include some elements similar to those illustrated in FIG. 4A in which similar elements may have reference numbers ending in similar digits. However, in the embodiment illustrated in FIG. 4B, the storage structure 440 may include one or more power control circuits 455 that may control, at least partly, the flow of power from, to, between, and/or the like, one or more of the device interfaces 442 and/or 443 and/or one or more devices that may be installed in one or more of the device interfaces 442 and/or 443. In some embodiments, one or more power control circuits 455 may be located, at least partly, on a midplane, backplane, and/or other connection board, and/or the like. In some embodiments, the one or more power control circuits 455 may be separate from the power connection fabric 441. In some embodiments, one or more power control circuits 455 may be integrated, at least partially, with the power connection fabric 441.

Figure 4C:
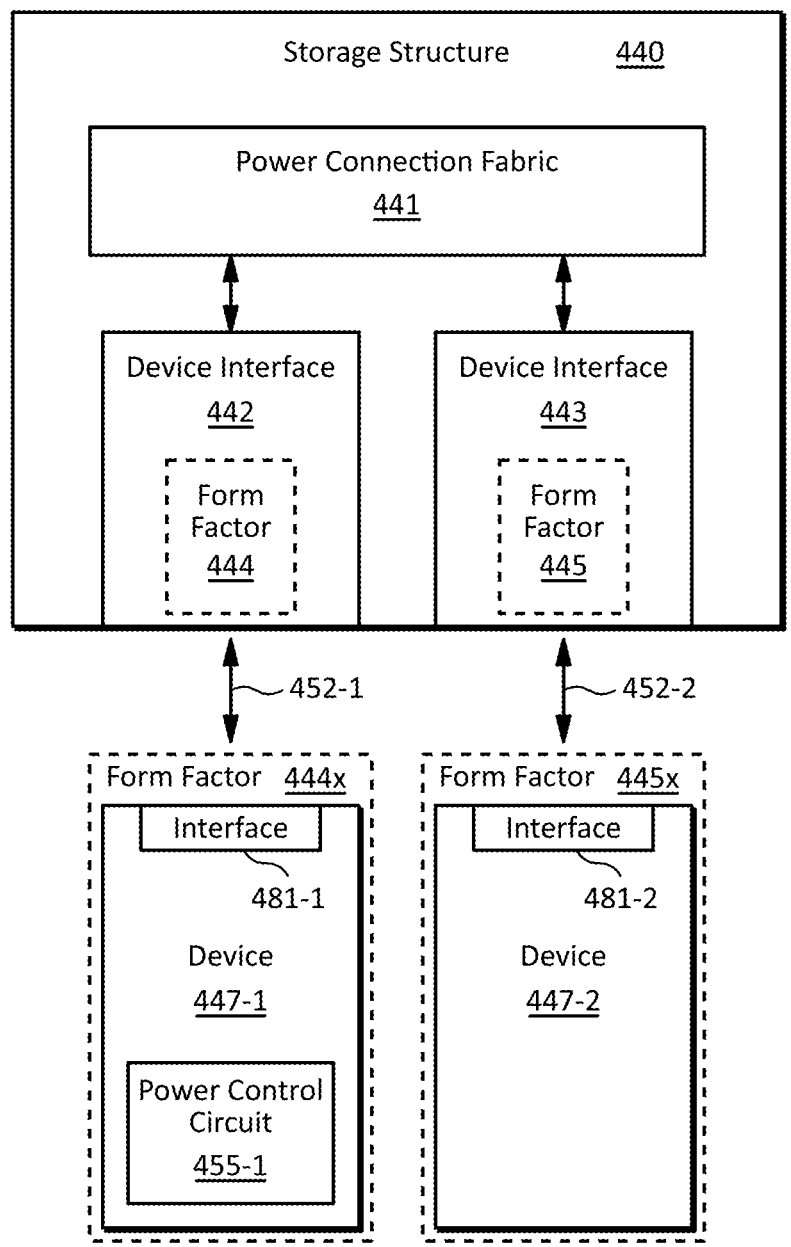
FIG. 4C illustrates a third embodiment of a scheme for providing power to a storage device in accordance with example embodiments of the disclosure.

FIG. 4C illustrates a third embodiment of a scheme for providing power to a storage device in accordance with example embodiments of the disclosure. The embodiment illustrated in FIG. 4C may include some elements similar to those illustrated in FIG. 4A in which similar elements may have reference numbers ending in similar digits. However, in the embodiment illustrated in FIG. 4C, a first device 447-1 may be installed in, and/or removed from, device interface 442 as shown by arrow 452-1. Additionally, or alternatively, a second device 447-2 may be installed in, and/or removed from, device interface 443 as shown by arrow 452-2. The first device 447-1 may have a form factor 444x that may be compatible with the form factor 444 of the first device interface 442. The second device 447-2 may have a form factor 445x that may be compatible with the form factor 445 of the second device interface 443.

In some embodiments, the first device 447-1 may include a power control circuit 455-1 that may control, at least partly, the flow of power from, to, between, and/or the like, the first device 447-1 and one or more other devices that may be installed in the storage structure 440, for example, the second device 447-2 which may be installed in device interface 443. In some embodiments, the second device 447-2 may include a power control circuit in addition to, or instead of, the power control circuit 455-1 of the first device 447-1.

In some embodiments, the first device 447-1 may include an interface (e.g., a connection interface) 481-1 that may enable the first device 447-1 to implement one or more connections (e.g., power connections, communication connections, and/or the like) to the device interface 442, the power connection fabric 441, the storage structure 440, another device (e.g., the second device 447-2), and/or the like. The interface 448-1 may be implemented, for example, with one or more electric and/or mechanical interfaces, connectors, connections, protocols, and/or the like.

In some embodiments, the second device 447-2 may include an interface (e.g., a connection interface) 481-2 that may enable the second device 447-2 to implement one or more connections (e.g., power connections, communication connections, and/or the like) to the device interface 443, the power connection fabric 441, the storage structure 440, another device (e.g., the first device 447-1), and/or the like. The interface 448-2 may be implemented, for example, with one or more electric and/or mechanical interfaces, connectors, connections, protocols, and/or the like.

Figure 4D:
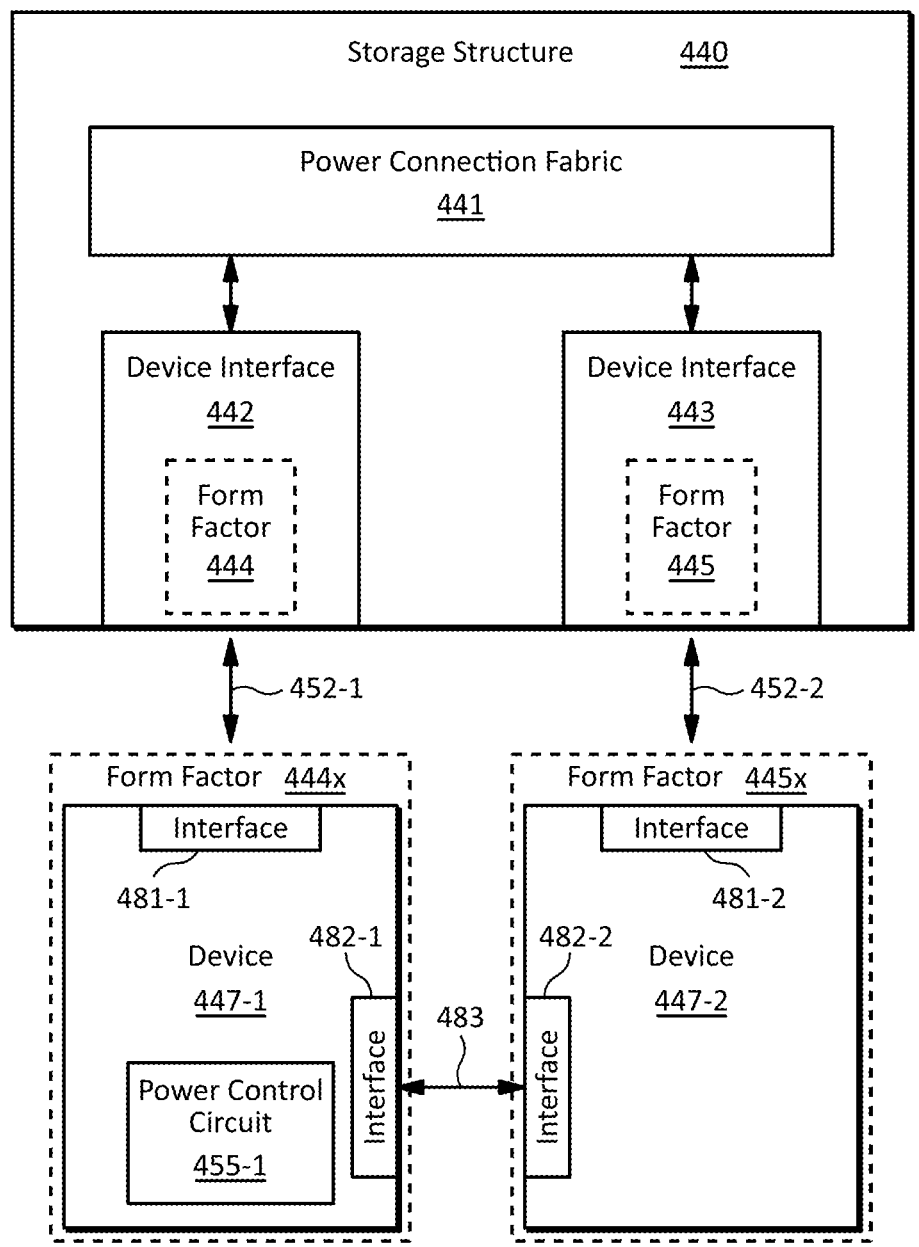
FIG. 4D illustrates a fourth embodiment of a scheme for providing power to a storage device in accordance with example embodiments of the disclosure.

FIG. 4D illustrates a fourth embodiment of a scheme for providing power to a storage device in accordance with example embodiments of the disclosure. The embodiment illustrated in FIG. 4D may include some elements similar to those illustrated in FIG. 4C in which similar elements may have reference numbers ending in similar digits. However, in the embodiment illustrated in FIG. 4D, the first device 447-1 may include a second interface (e.g., a connection interface) 482-1 that may enable the first device 447-1 to implement one or more connections (e.g., power connections, communication connections, and/or the like) to the device interface 442, the power connection fabric 441, the storage structure 440, another device (e.g., the second device 447-2), and/or the like. For example, as illustrated in FIG. 4D, the second interface 482-1 may be configured enable first device 447-1 to implement one or more connections 483 (e.g., one or more power connections, communication connections, and/or the like) with the second device 447-2. The interface 448-1 may be implemented, for example, with one or more electric and/or mechanical interfaces, connectors, connections, protocols, and/or the like.

In some embodiments, the second device 447-2 may include a second interface (e.g., a connection interface) 482-2 that may enable the second device 447-2 to implement one or more connections (e.g., power connections, communication connections, and/or the like) to the device interface 442, the power connection fabric 441, the storage structure 440, another device (e.g., the first device 447-1), and/or the like. For example, as illustrated in FIG. 4D, the second interface 482-2 may be configured enable second device 447-2 to implement one or more connections 483 (e.g., one or more power connections, communication connections, and/or the like) with the first device 447-1. The interface 448-2 may be implemented, for example, with one or more electric and/or mechanical interfaces, connectors, connections, protocols, and/or the like.

Figure 5:
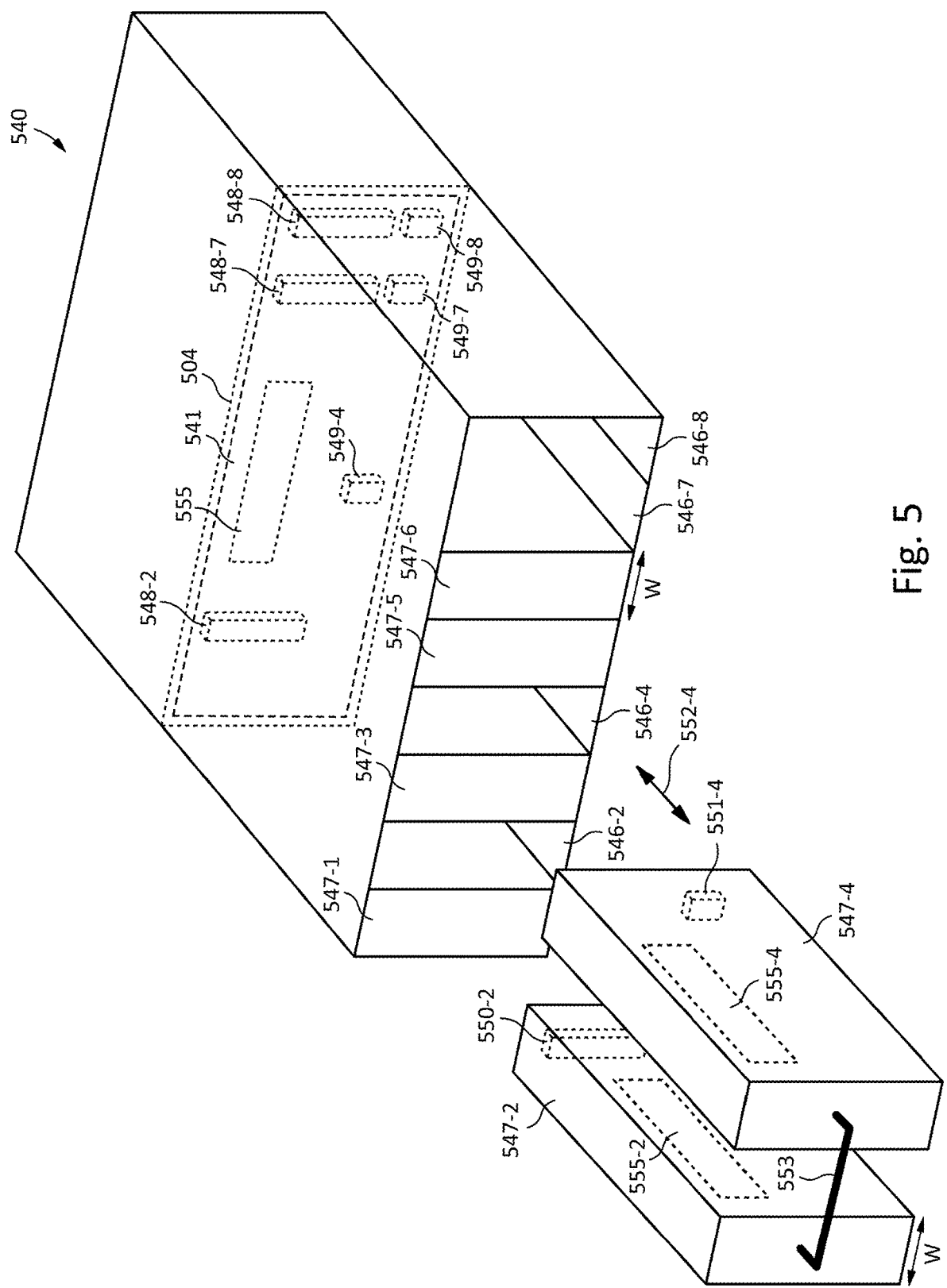
FIG. 5 illustrates an embodiment of a storage system in accordance with example embodiments of the disclosure.

FIG. 5 illustrates an embodiment of a storage system in accordance with example embodiments of the disclosure. The embodiment illustrated in FIG. 5 may be used, for example, with the scheme for providing power to a storage device illustrated in FIG. 4.

Referring to FIG. 5, a storage server 540 may have one or more device slots (e.g., drive bays) 546-1 through 546-8 (which may be referred to individually and/or collectively as 546). The embodiment illustrated in FIG. 5 may also include one or more devices 547-1 through 547-6 (which may be referred to individually and/or collectively as 547).

For purposes of illustration, the device slots 546 and devices 547 may be shown with similar dimensions including a width of W, but in some embodiments, different slots 546 and/or devices 547 may have different widths and/or other dimensions. Also for purposes of illustration, the device slots 546 and/or devices 547 may be described as being compatible with a single device form factor (which may be referred to as a common device form factor for the storage server 540), but in some embodiments, different slots 546 and/or corresponding devices 547 may have different form factors. Moreover, the embodiment illustrated in FIG. 5 may be shown with eight device slots, but other embodiments may include any number of slots.

In the embodiment illustrated in FIG. 5, devices 547-1, 547-3, 547-5, and 547-6 are shown in stalled in device slots 546-1, 546-3, 546-5, and 546-6, respectively. Any adjacent device slots 546 may be used collectively to receive one or more devices that may be compatible with the common device form factor but having a different width, for example, two times the width W (2×W) which may be referred to as a double-width device. Thus, for example, slots 546-7, and 546-8 may collectively form a double-width slot 546-7/8 that may receive a device 547 having a width of 2×W.

Additionally, or alternatively, a slot 546 may be used to receive one or more devices that may be compatible with the common device form factor but having a smaller width, for example, one-half the width W (0.5×W) which may be referred to as a half-width devices. Thus, for example, the slot 546-7 may be used to receive two half-width devices 547.

Additionally, or alternatively, a slot 546 may be used to receive one or more devices that may be compatible with the common device form factor but having a smaller height, for example, one-half of a height H (0.5×H) which may be referred to as a half-height devices. Thus, for example, the slot 546-7 may be used to receive two half-height devices 547.

Additionally, or alternatively, more than one common form factor may be used in a storage structure. For example, a first group of slots may be implemented with a first common form factor, and a second group of slots may be implemented with a second common form factor.

For purposes of illustration, device 547-2 (as well as any of the other devices 547) may be implemented, at least in part, as a storage device that may use any type of nonvolatile storage media such solid state media, magnetic media, optical media, and/or the like. For example, in some embodiments, the storage device 547-2 may be implemented as an SSD based on not-AND (NAND) flash memory, persistent memory such as cross-gridded nonvolatile memory, memory with bulk resistance change, phase change memory (PCM), and/or the like, or any combination thereof. In some embodiments, however, the device 547-2 may be implemented, at least in part, as any other type of device such as an accelerator, graphics processing unit (GPU), data processing unit (DPU), neural processing unit (NPU), tensor processing unit (TPU), memory buffer device, cache memory device, memory expansion device, network interface card (NIC), and/or the like, or any combination thereof.

For purposes of illustration, device 547-4 (as well as any of the other devices 547) may be implemented, at least in part, as a power device that may provide power (e.g., backup power, supplemental power, and/or the like) to one or more other devices 547 in the server 540. For example, in some embodiments, the storage device 547-4 may include a power source such as one or more batteries (e.g., a battery pack), one or more supercapacitors (e.g., a capacitor pack), and/or the like, or any combination thereof.

The embodiment illustrated in FIG. 5 may also include a power connection fabric 541 that may enable one or more of the devices 547 that may be implemented at least partially as a power device to device to supply power to one or more other devices 547. For example, in some embodiments, the power connection fabric 541 may be implemented with one or more conductive traces on a circuit board (e.g., a midplane) that may connect one or more connectors that may be used to one or more of the devices 547 to the power connection fabric 541. The power connection fabric 541 may be located, for example, on a midplane 504. In some embodiments, one or more connections implemented by the power connection fabric 541 may vary based on a configuration of components that may be connected to the power connection fabric 541.

For purposes of illustration, the embodiment illustrated in FIG. 5 may also include a first connector 548-2 which may be implemented, for example, as a storage device connector, and a second connector 549-4, which may be implemented, for example, as a power connector. The storage device 547-2 may include a connector 550-2 which may be implemented, for example, as a storage device connector that may be compatible with the connector 548-2. The power device 547-4 may include a power connector 551-4 that may be compatible with the connector 549-4. Thus, the storage device 547-2 may be installed in the storage server 540 by inserting it into device slot 546-2 which may cause connector 550-2 to engage with connector 548-2 to connect the storage device 547-2 to the power connection fabric 541. Similarly, the power device 547-4 may be installed in the storage server 540 by inserting it into device slot 546-4 as shown by arrow 552-4 which may cause connector 551-4 to engage with connector 549-4 to connect the power device 547-4 to the power connection fabric 541. (Components may be shown with dashed lines to indicate that they may not be directly visible because of being located inside an enclosure of the storage server 540, behind or inside a device 547, and/or the like.)

Thus, depending on the implementation details, the power device 547-4 may provide power (e.g., backup power) to the storage device 547-2 through the power connection fabric 541. In some embodiments, the power connection fabric 541 may include one or more switches, jumpers, and/or the like that may enable the power connection fabric 541 to be configured (e.g., manually, automatically using a power control circuit, and/or the like) to connect the power device 547-4 to the storage device 547-2. Additionally, or alternatively, the power connection fabric 541 may be configured to connect any device 547 that may be implemented, at least partially, as a power device to any other device or devices.

In some embodiments, one or more device slots 546 and/or one or more corresponding connectors 548 and/or 549 may collectively form, at least in part, a device interface. For example, a first device interface (for example, such as the first device interface 442 illustrated in FIG. 4) may include device slot 546-2 and connector 548-2, and a second device interface (for example, such as the second device interface 443 illustrated in FIG. 4) may include device slot 546-4 and 549-4. As another example, a third device interface may include device slots 546-7 and 546-8 (and one or more corresponding connectors for the power connection fabric 541 if present).

Additionally, or alternatively, one or more slots may include more than one connector to enable either a storage device or a power device to be installed in the slot. For example, a connector 548-7 (which may be implemented with a storage device connector) and a connector 549-7 (which may be implemented with a power connector) may be located on the midplane 504 and connected to the power connection fabric 541 such that a corresponding storage device connector 550 on a storage device may engage the connector 548-7 if the storage device is installed in slot 546-2, or a corresponding power connector 551 on a power device may engage the connector 549-7 if the power device is installed in the slot 546-2. Connectors 548-8 and 549-8 may be arranged in a similar configuration for slot 546-8. Although the connectors 548-7 and 549-7 (and 548-8 and 549-8) are arranged above and below each other in the embodiment illustrated in FIG. 5, in some embodiments they may be arranged side-by-side or in any other configuration.

Alternatively, or additionally, one or more connections may be implemented between any of the devices 547 (e.g., one or more direct connections that may be an alternative to, and/or in addition to, one or more connections using the power connection fabric 541). For example, a connection 553 may be established between the storage device 547-2 and the power device 547-4. The connection 553 may be implemented, for example, using one or more a cables, wires, connectors, and/or the like. In some embodiments in which the storage device 547-2 and power device 547-4 may be inserted into adjacent slots, the connection 553 may be implemented with a first connector on the storage device 547-2 that may engage directly with a second connector on the power device 547-4 as illustrated, for example, in FIG. 18 in which first connector 1867 may engage second connector 1868.

In some embodiments, the storage structure 540 may also include one or more power control circuits 555 that may control, at least partly, the flow of power from, to, between, and/or the like, one or more of the devices 547. In some embodiments, one or more power control circuits 555 may be located, at least partly, at the storage structure 540, the midplane 554 or other connection board, and/or the like. In some embodiments, the one or more power control circuits 555 may be separate from the power connection fabric 541. In some embodiments, one or more power control circuits 555 may be integrated, at least partially, with the power connection fabric 541. In some embodiments, one or more power control circuits 555-2 and/or 555-4 may be located, at least partially, at one or more of the devices 547-2 and/or 547-4, respectively.

In some embodiments, the connector 550-2 may be implemented as part of a first interface of the storage device 547-2 (e.g., similar to the first interface 481-1 illustrated in FIG. 4C or FIG. 4D), and the connection 553 and/or any other connector and/or connections between devices (e.g., a connector 1867 illustrated in FIG. 18) may be implemented as part of a second interface of the storage device 547-2 (e.g., similar to the second interface 482-1 illustrated in FIG. 4D). In some embodiments, the connector 551-4 may be implemented as part of a first interface of the power device 547-4 (e.g., similar to the first interface 481-2 illustrated in FIG. 4C or FIG. 4D), and the connection 553 and/or any other connector and/or connections between devices (e.g., a connector 1868 illustrated in FIG. 18) may be implemented as part of a second interface of the power device 547-4 (e.g., similar to the second interface 482-2 illustrated in FIG. 4D).

Figure 6:
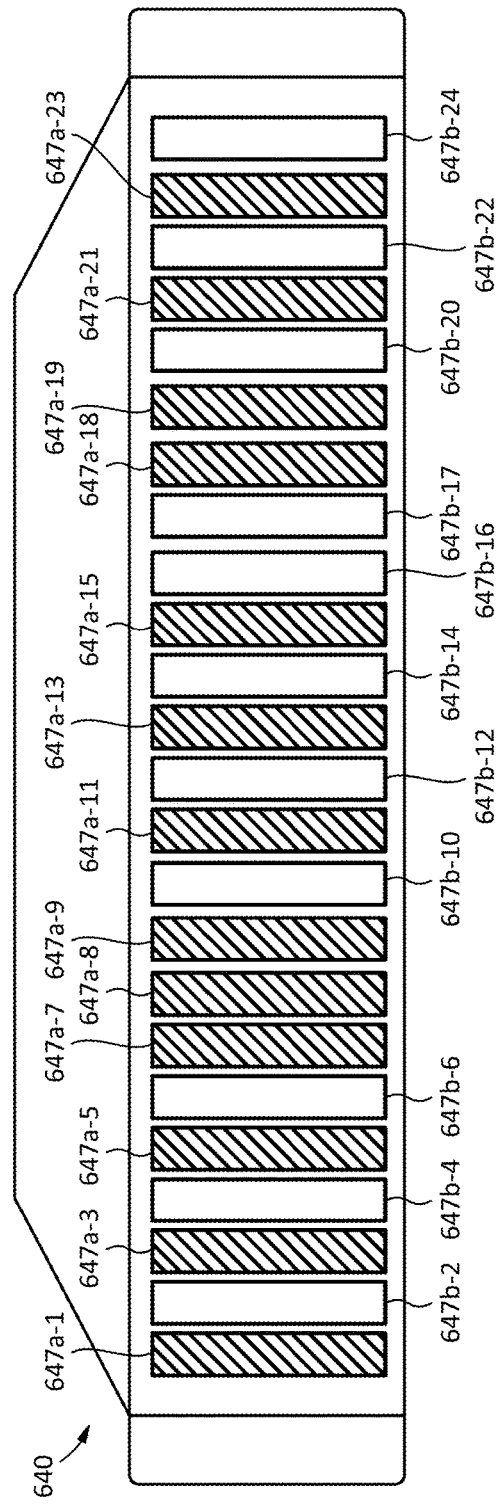
FIG. 6 illustrates a front view of an embodiment of a storage system having a first configuration of devices in accordance with example embodiments of the disclosure.

FIG. 6 illustrates a front view of an embodiment of a storage system having a first configuration of devices in accordance with example embodiments of the disclosure. The embodiment illustrated in FIG. 6 may be used, for example, with the embodiments illustrated in FIG. 4 and/or FIG. 5. Referring to FIG. 6, a storage server 640 may include 24 device slots that may be compatible with a common device form factor in a manner similar to the embodiment illustrated in FIG. 5. In the embodiment illustrated in FIG. 6, storage devices (shown with shading) 647*a*-1, -3, -5, -7, -8, -9, -11, -13, -15, -18, -19, -21, and/or -23 (which may be referred to individually and/or collectively as 647*a*) may be installed (e.g., inserted) in corresponding device slots and connected to a power connection fabric using one or more connectors in a manner similar to that illustrated in FIG. 5. Power devices (shown without shading) 647*b*-2, -4, -6, 10, -12, -14, -16, -17, -20, -22, and/or -24 (which may be referred to individually and/or collectively as 647*b*) may be installed (e.g., inserted) in corresponding device slots and connected to the power connection fabric using one or more connectors in a manner similar to that illustrated in FIG. 5.

One or more of the storage devices 647*a* and/or power devices 647*b* may be connected through a power connection fabric that may be configured in various arrangements to enable one or more or more of the power devices 647*b* to provide power to one or more of the storage devices 647*a*. For example, in some embodiments, the power connection fabric may include a first bus that may connect the storage devices 647*a* and a second bus that may connect the power devices 647*b*. As another example, the power connection fabric may include one or more connections that may connect one or more (e.g., each) power device 647*b* to an adjacent storage device 647*a*. As a further example, the power connection fabric may include one or more jumpers, switches, and/or the like that may enable the power connection fabric to be configured to connect one or more power devices 647*b* to one or more storage device 647*a* as may be determined, for example, by a system administrator. In some embodiments, one or more connections of the power connection fabric may be hard-wired (e.g., with cables, traces on a circuit board, and/or the like), configured using jumpers, switches, and/or the like, or a combination thereof.

Figure 7:
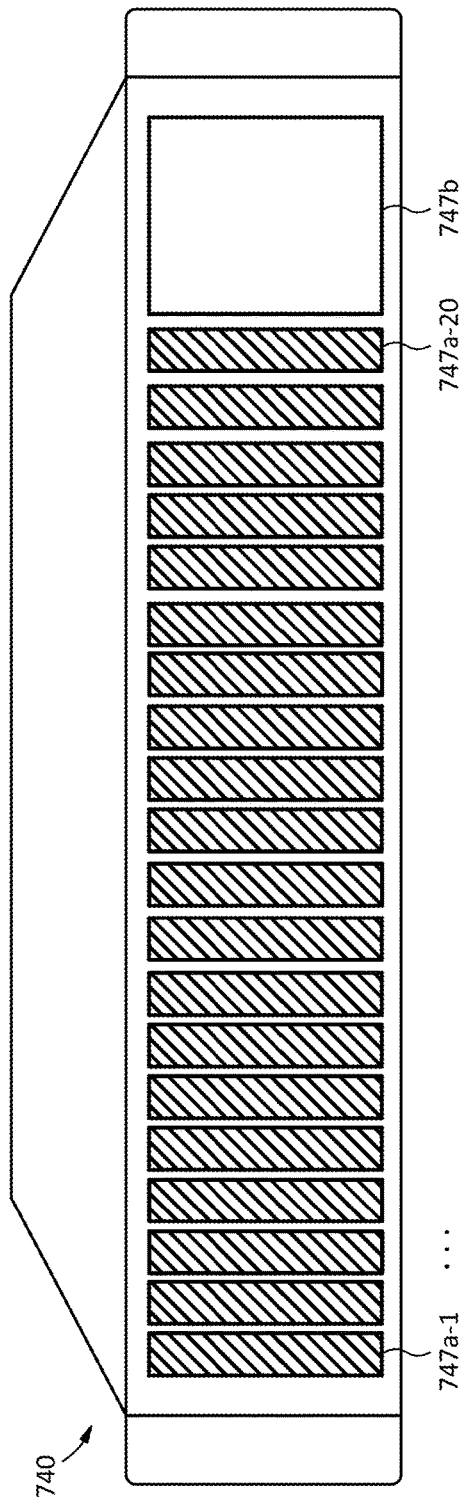
FIG. 7 illustrates a front view of an embodiment of a storage system having a second configuration of devices in accordance with example embodiments of the disclosure.

FIG. 7 illustrates a front view of an embodiment of a storage system having a second configuration of devices in accordance with example embodiments of the disclosure. The embodiment illustrated in FIG. 7 may be used, for example, with the embodiments illustrated in FIG. 4 and/or FIG. 5. Referring to FIG. 7, a storage server 740 may include 24 device slots that may be compatible with a common device form factor in a manner similar to the embodiment illustrated in FIG. 5. In the embodiment illustrated in FIG. 7, storage devices (shown with shading) 747*a*-1 through 747*a*-20 (which may be referred to individually and/or collectively as 747*a*) may be installed (e.g., inserted) in corresponding adjacent device slots and connected to a power connection fabric using one or more connectors in a manner similar to that illustrated in FIG. 5.

A power device (shown without shading) 747*b*, which may be implemented, for example, with a width having four times the width of a common device form factor, may be installed (e.g., inserted) in four adjacent corresponding slots and connected to the power connection fabric using one or more connectors in a manner similar to that illustrated in FIG. 5. Thus, the power device 747*b* may be implemented as a quad-width device that may have a relatively large power source capacity, for example, due to having relatively more space for power sources such as batteries, supercapacitors, tantalum capacitors, and/or the like.

The power connection fabric may be configured to connect the power device 747*b* to one or more of the storage devices 747*a* using one common bus to supply power (e.g., backup power) to one or more (e.g., all) of the storage devices 747*a*, using multiple buses that may each supply power to one or more of the storage devices 747*a*, using individual connections to one or more (e.g., each) of the storage devices 747*a*, or using any combination thereof. In some embodiments, one or more connections of the power connection fabric may be hard-wired (e.g., with cables, traces on a circuit board, and/or the like), configured using jumpers, switches, and/or the like, or a combination thereof.

Figure 8:
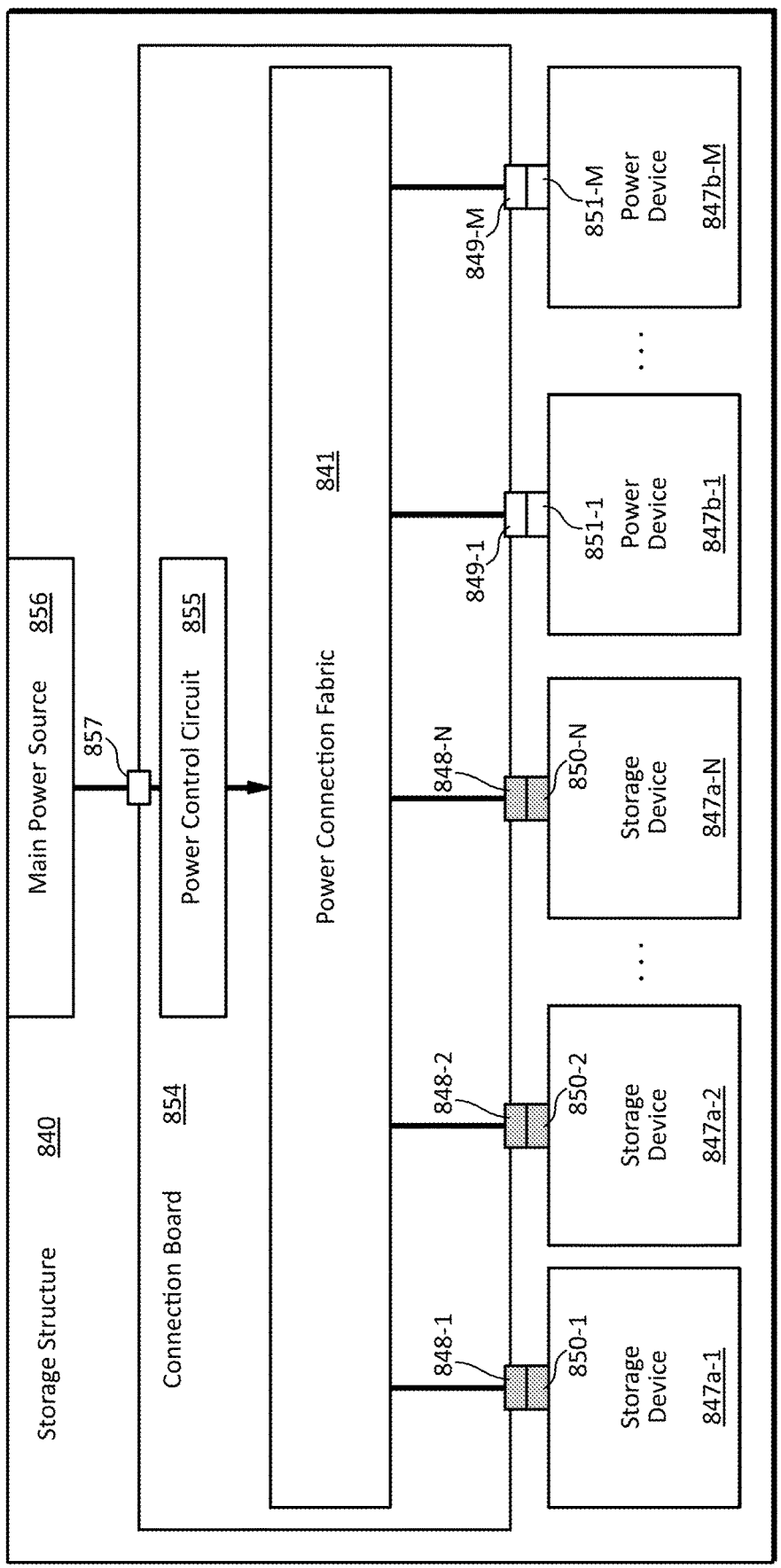
FIG. 8 illustrates an embodiment of a storage system having a power control circuit in accordance with example embodiments of the disclosure.

FIG. 8 illustrates an embodiment of a storage system having a power control circuit in accordance with example embodiments of the disclosure. The embodiment illustrated in FIG. 8 may include a storage structure 840 in which one or more storage devices 847*a*-1, . . . , 847*a*-N (which may be referred to individually and/or collectively as 847-*a*) and one or more power devices 847*b*-1, . . . , 847*b*-M (which may be referred to individually and/or collectively as 847*b*) may be installed. One or more of the storage devices 847*a* and/or power devices 847*b* may be installed, for example, in device slots such as the device slots 546 illustrated in FIG.

5. (To simplify the drawings, not all storage devices 847*a* and/or power devices 847*b* may be illustrated.) Any of the storage devices 847*a*, power devices 847*b*, and/or corresponding device slots may be implemented with one or more common form factors based on one or more device dimensions such as width, height, length, and/or the like.

The storage structure 840 may include a power connection fabric 841 that may be located at least partially on a connection board (e.g., a midplane, a backplane, and/or the like) 854. The connection board 854 may include one or more connectors (e.g., storage device connectors) 848-1, . . . , 848-N (which may be referred to individually and/or collectively as 848) that may be used to connect the one or more storage devices 847*a* to the power connection fabric 841. The connection board 854 may also include one or more connectors (e.g., power connectors) 849-1, . . . , 849-M (which may be referred to individually and/or collectively as 849) that may be used to connect the one or more power devices 847*b* to the power connection fabric 841.

In some embodiments, one or more of the storage devices 847*a* may include one or more connectors 850-1, . . . , 850-N (which may be referred to individually and/or collectively as 850) that may engage with corresponding connectors 848 on the connection board 854, and/or one or more of the power devices 847*b* may include one or more connectors 851-1, . . . , 851-M (which may be referred to individually and/or collectively as 851) that may engage with corresponding connectors 849 on the connection board 854.

The storage structure 840 may also include one or more power sources (e.g., main power sources) 856 that may be connected to the power connection fabric 841, for example, through one or more connectors 857. Although not illustrated in FIG. 8, in some embodiments, the storage structure 840 may also include additional apparatus such as one or more motherboards such as motherboard 311 illustrated in FIG. 3.

The storage structure 840 may also include one or more power control circuits 855 that may control, at least partly, the flow of power from, to, between, and/or the like, one or more of the storage devices 847*a* and/or one or more of the power devices 847*b*. In some embodiments, one or more power control circuits 855 may be located, at least partly, at the storage structure 840, connection board 854, and/or the like. In some embodiments, the one or more power control circuits 855 may be separate from the power connection fabric 841. In some embodiments, one or more power control circuits 855 may be integrated, at least partially, with the power connection fabric 841.

In some embodiments, a power control circuit 855 may implement one or more features such as charging one or more of the power devices 847*b* (e.g., using power from a main power source 856, from one or more of the storage devices 847*a*, and/or the like), monitoring a charge state of one or more of the power devices 847*b*, sending information about a charge state of one or more of the power devices 847*b* (e.g., to a storage system, one or more of the storage devices 847*a*, and/or the like), and/or transferring power (e.g., backup power) from one or more of the power devices 847*b* to one or more of the storage devices 847*a*. In some embodiments, one or more power control circuits 855 may be implemented, at least in part, as a power loss prevention (PLP) circuit, logic, and/or the like.

Figure 9:
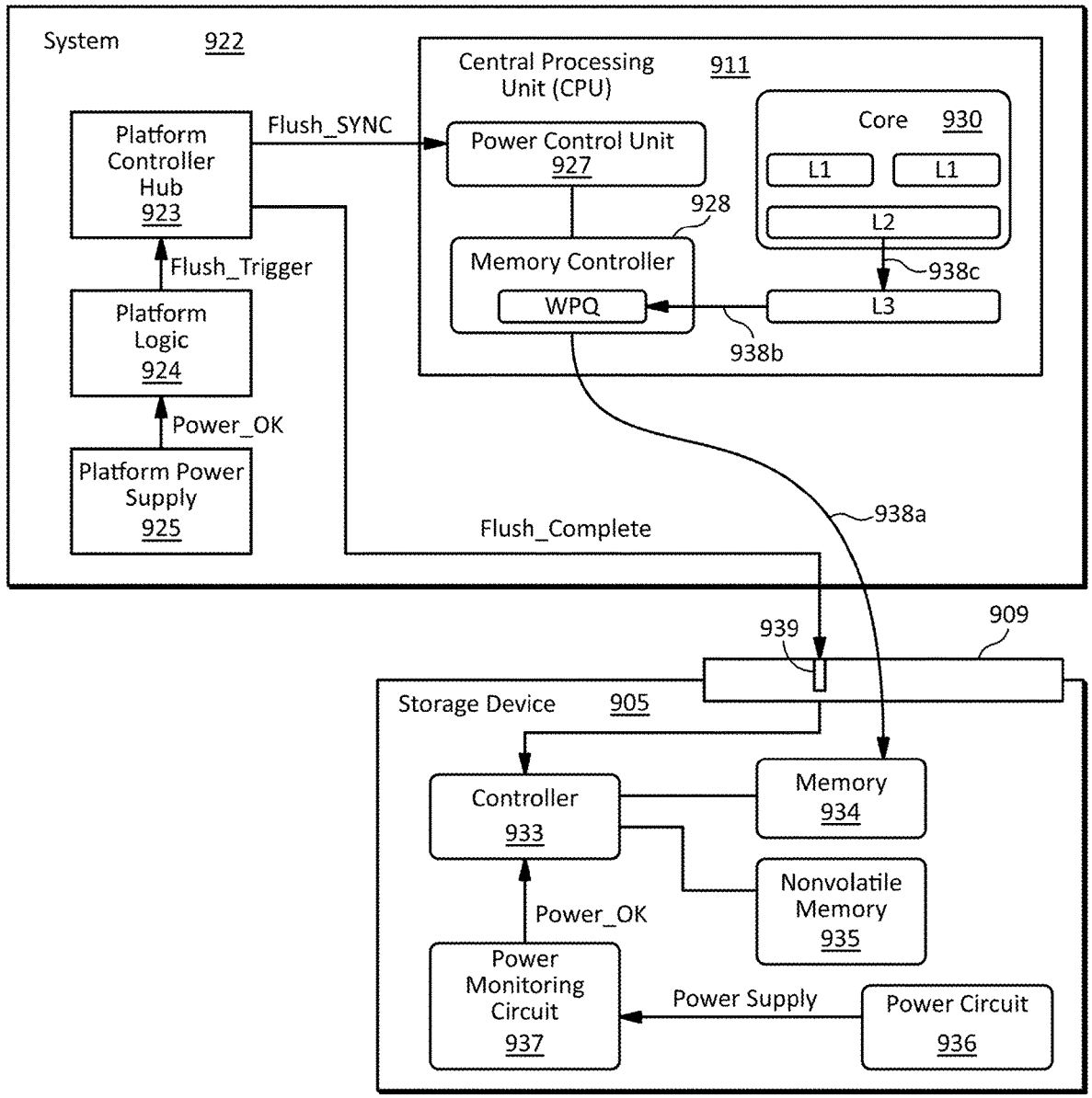
FIG. 9 illustrates an embodiment of a scheme for flushing data to a storage device in accordance with example embodiments of the disclosure.

FIG. 9 illustrates an embodiment of a scheme for flushing data to a storage device in accordance with example embodiments of the disclosure. The embodiment illustrated in FIG. 9 may be used with the embodiment illustrated in FIG. 8 and/or any embodiment in which data may be flushed to a storage device. The embodiment illustrated in FIG. 9 may include some elements similar to those illustrated in FIG. 1 in which similar elements may have reference numbers ending in similar digits. However, in the embodiment illustrated in FIG. 9, the CPU 911 may flush data from one or more locations (e.g., one or more of the L1, L2, and/or L3 caches, and/or the WPQ) to volatile memory (e.g., DRAM) 934 in the storage device 905 as shown by arrows 938*a*, 938*b*, and/or 938*c* based, for example, on a power loss event (e.g., a failure of the platform power supply 925).

The controller 933 in the storage device 905 may also execute an internal flush operation in which data stored in the volatile memory 934 may be preserved by flushing (e.g., copying) the data to the storage media 935 based, for example, on a power loss event. During an internal flush operation, one or more power circuits 936 may provide backup power to the storage device 905, for example, from one or more batteries, supercapacitors, tantalum capacitors, and/or the like.

Additionally, or alternatively, the storage device 905 may receive backup power from a power device (e.g., one of the power devices 847*b* illustrated in FIG. 8) based, for example, on a power control circuit (e.g., the power control circuit 855 illustrated in FIG. 8) detecting a power loss event. In some embodiments, the controller 933 may control (e.g., delay) an internal flush operation until data from one or more external sources is flushed to the storage device 905. For example, controller 933 may delay an internal flush operation until it receives a flush complete signal (e.g., Flush_Complete) from the platform controller hup 923, the CPU 911, and/or one or more other sources. The storage device 905 may receive a flush complete signal in any manner, for example, using an SMBus, a PCIe signal, a network (Ethernet) signal, and/or the like. In some embodiments, the storage device 905 may receive a flush complete signal using a pin of a PCIe connector such as a reserved for future use (RFU) pin 939 of connector 909.

Figure 10:
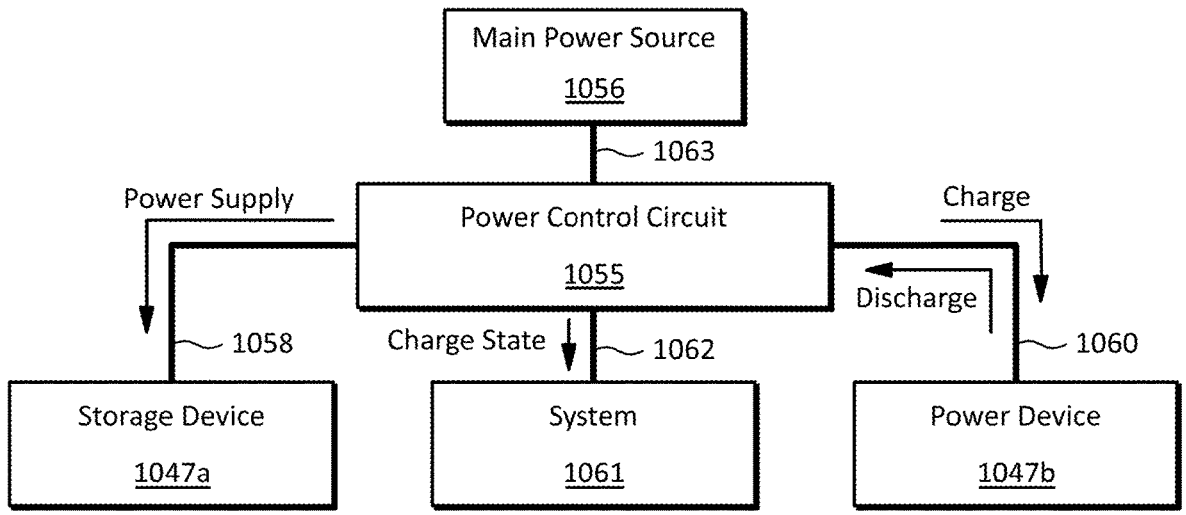
FIG. 10 illustrates an example embodiment of a first scheme for providing power to a storage device in accordance with example embodiments of the disclosure.

FIG. 10 illustrates an example embodiment of a first scheme for providing power to a storage device in accordance with example embodiments of the disclosure. In the embodiment illustrated in FIG. 10, a power control circuit 1055 may be connected to a storage device 1047*a* through a first power connection 1058, a power device 1047*b* through a second power connection 1060, and/or a main power source 1056 through a third power connection 1063. The power control circuit 1055 may also be connected to a system (e.g., a motherboard, baseboard management controller (BMC), and/or the like) 1061 through a communication connection 1062.

In some embodiments, the first power connection 1058 and/or the second power connection 1060 may be implemented, for example, as part of a power connection fabric (e.g., using one or more traces on a circuit board, wires, cables, jumpers, switches, relays, and/or the like). In some embodiments, the communication connection 1062 may implemented with any communication interface, protocol, and/or the like including system management bus (SMBus), PCIe, Ethernet, Nonvolatile Memory Express (NVMe), Compute Express Link (CXL), and/or the like.

In some embodiments, the power control circuit 1055 may charge, and/or control the charging of, the power device 1047*b* through the second power connection 1060, for example, using power provided by the main power source 1063, the storage device 1047*a*, a combination thereof, and/or the like.

In some embodiments, the power control circuit 1055 may monitor a charge state of the power device 1047*b*, for example, by measuring a charge voltage and/or a charge current of one or more batteries, supercapacitors, tantalum capacitors, and/or the like within the power device 1047b. For example, the power control circuit 1055 may monitor a charge state of the power device 1047b to determine if the power device 1047b has a normal status (e.g., has adequate charge that may be capable of suppling sufficient backup power to the storage device 1047a to enable the storage device 1047a to perform a flush operation based on a power loss event).

In some embodiments, the power control circuit 1055 may sending information about a charge state of the power device 1047b to the storage system (e.g., a motherboard, a BMC, and/or the like) 1061, the storage device 1047a, and/or the like. For example, the power control circuit 1055 may notify the storage system 1061 and/or the storage device 1047a whether the power device 1047b is in a normal state (e.g., has adequate charge that may be capable of suppling sufficient backup power to the storage device 1047a to enable the storage device 1047a to perform a flush operation based on a power loss event). Thus, the system 1061 and/or the storage device 1047a may detect an abnormal state of the power device 1047b and take one or more corresponding actions such as notifying a system administrator that the power device 1047b may benefit from service, replacement, repair, expansion, upgrading, and/or the like.

In some embodiments, the power control circuit 1055 may transfer, and/or control the transfer of, power from the main power source 1056 and/or the power device 1047b to the storage device 1047a. For example, the power control circuit 1055 may transfer, and/or control the transfer of, power from the main power source 1056 to the storage device 1047a during normal operation. Additionally, or alternatively, the power control circuit 1055 may, based on detecting a power loss event, transfer, and/or control the transfer of, backup power from the power device 1047b to the storage device 1047a, for example, to enable the storage device 1047a to perform a data flush operation (e.g., to move and/or copy data from volatile memory to nonvolatile memory). In some embodiments, the storage device 1047a may implement a function (e.g., an independent function) to monitor, confirm, and/or the like, a normal charge state of the storage device 1047a and/or a proper supply of power from the main power source 1056 and/or the power device 1047b to the storage device 1047a.

Although only one power control circuit 1055, storage device 1047a, and/or power device 1047b may be illustrated in FIG. 10, some embodiments may include any number of power control circuits 1055, storage devices 1047a, and/or power devices 1047b.

Figure 11:
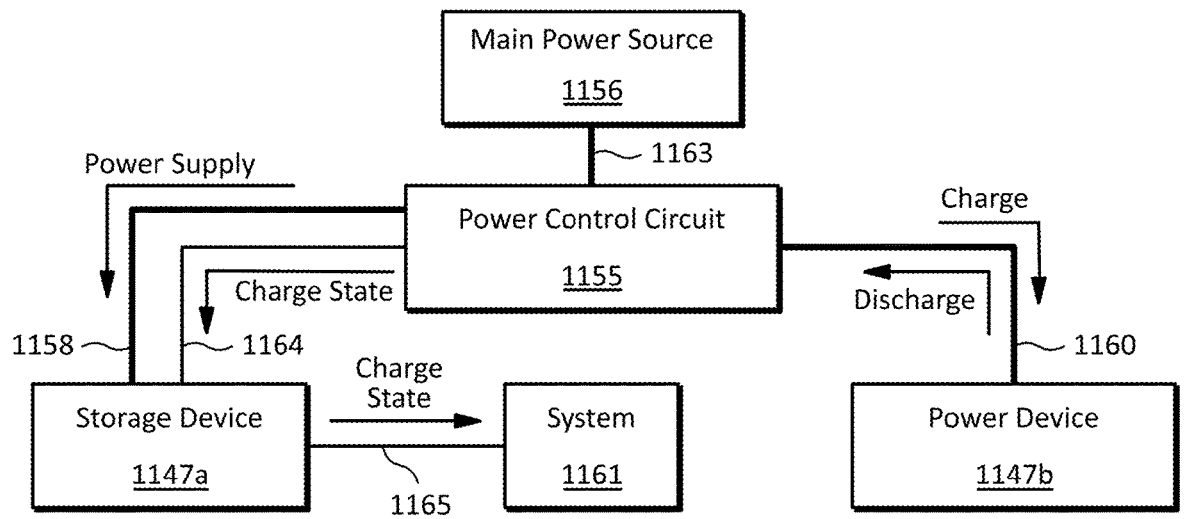
FIG. 11 illustrates an example embodiment of a second scheme for providing power to a storage device in accordance with example embodiments of the disclosure.

FIG. 11 illustrates an example embodiment of a second scheme for providing power to a storage device in accordance with example embodiments of the disclosure. The embodiment illustrated in FIG. 11 may include some elements similar to those illustrated in FIG. 10 in which similar elements may have reference numbers ending in similar digits. However, in the embodiment illustrated in FIG. 11, the storage device 1147a may be connected to the power control circuit 1155 through a first communication connection 1164 and to the system 1161 through a second communication connection 1165. In this configuration, the power control circuit 1155 may notify the storage device 1147a, for example, of a status (e.g., a charge state) of the power device 1147b. Based on this status information, the storage device 1147a may take one or more corresponding actions such as notifying the system 1161, a system administrator, and/or the like, of the status of the power device 1147b.

In any embodiments disclosed herein that may be implemented with multiple instances of the same or similar components that may be distinguished with suffixes (e.g., -1, . . . ; -a, . . . ; -1A, . . . ; and/or the like), the components may be referred to individually and/or collectively without the suffixes.

Figure 12:
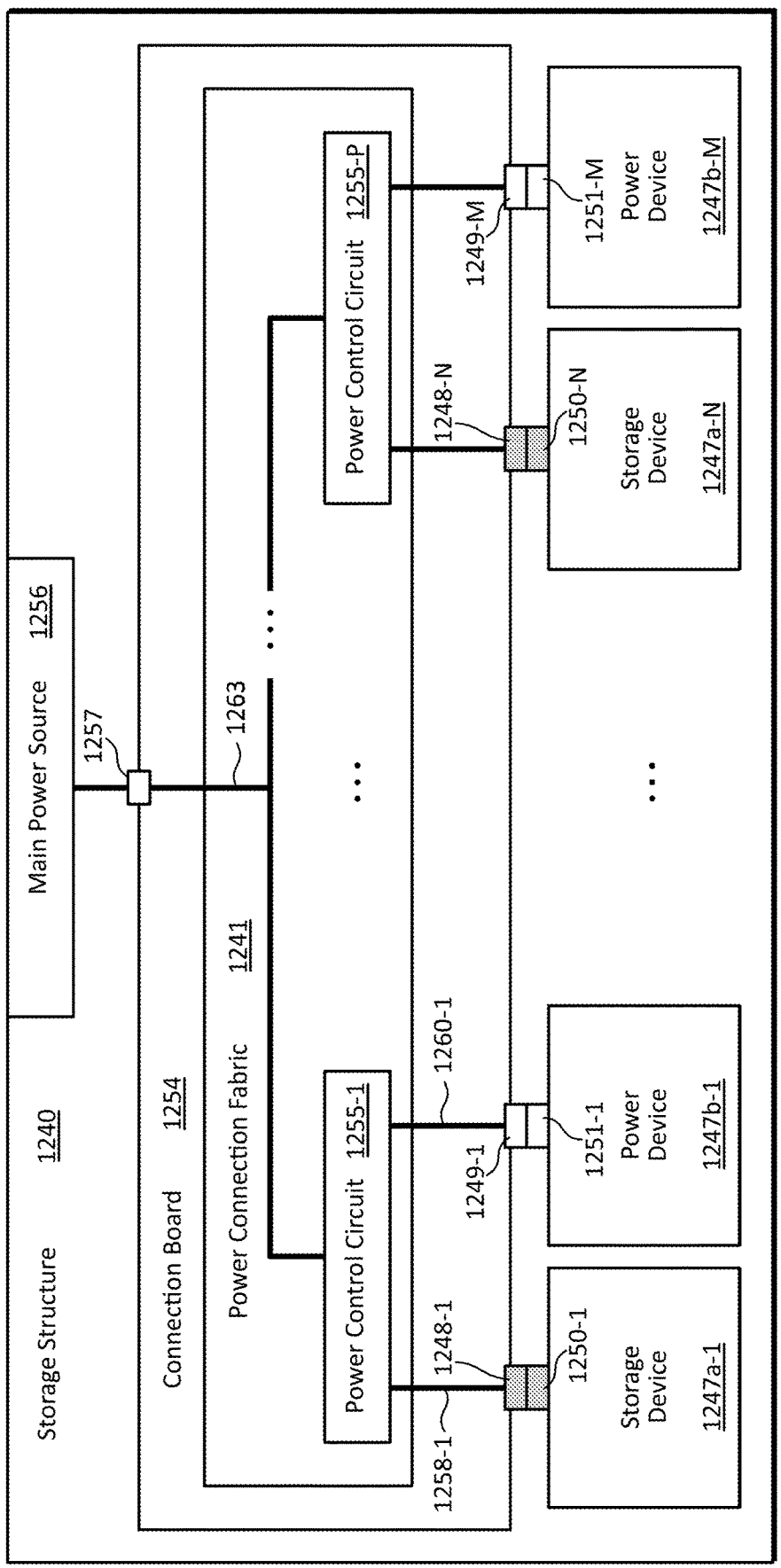
FIG. 12 illustrates an example embodiment of storage system having a first configuration in accordance with example embodiments of the disclosure.

FIG. 12 illustrates an example embodiment of storage system having a first configuration in accordance with example embodiments of the disclosure. The embodiment illustrated in FIG. 12 may include some elements similar to those illustrated in FIG. 8 in which similar elements may have reference numbers ending in similar digits. However, in the embodiment illustrated in FIG. 12, one or more storage devices 1247a and/or power devices 1247b may be arranged in groups along with corresponding power control circuits 1255. For example, storage device 1247a-1 and power device 1247b-1 may be arranged in a group along with power control circuit 1255-1.

In the embodiment illustrated in FIG. 12, the storage structure 1240 may include a power connection fabric 1241 that may include a first connection 1263 that may connect the power control circuit 1255-1 to a main power source 1256, a second connection 1258-1 that may connect the power control circuit 1255-1 to the storage device 1247a-1 (e.g., through connectors 1248-1 and/or 1250-1), and a third connection 1260-1 that may connect the power control circuit 1255-1 to the power device 1247b-1 (e.g., through connectors 1249-1 and/or 1251-1). In some embodiments, the power control circuit 1255-1 may be characterized as part of the power connection fabric.

Any of the storage devices 1247a, power devices 1247b, and/or corresponding device slots may be implemented with one or more common form factors based on one or more device dimensions such as width, height, length, and/or the like.

The power control circuit 1255-1 may provide power to the storage device 1247a-1 from the main power source 1256 during normal operation. The power control circuit 1255-1 may provide power to the storage device 1247a-1 from the power device 1247b-1, for example, based on detecting a loss of power from the main power source 1256. In some embodiments, power provided to the storage device 1247a-1 from the power device 1247b-1 may enable the storage device 1247a-1 to control (e.g., delay) a flush operation based, for example, on a flush complete signal received from a system (e.g., a motherboard, a BMC, and/or the like).

The power control circuit 1255-1 may also perform one or more additional functions such as charging the power device 1247b-1 (e.g., using power from the main power source 1256) during normal operation, monitoring a charge state of the power device 1247b-1, and/or sending information about a charge state of the power device 1247b-1, for example, to a system (e.g., a motherboard, a BMC, and/or the like).

In some embodiments, the storage structure 1240 may include one or more additional groups of storage devices 1247a, power devices 1247b, and/or power control circuits 1255. Alternatively, or additionally, one or more additional groups may be connected to one or more additional main power supplies 1256. In some embodiments, a group of one or more storage devices 1247a, power devices 1247b, and/or power control circuits 1255 may be referred to as a power group (e.g., a backup power group).

Depending on the implementation details, the embodiment illustrated in FIG. 12 may operate as follows. The power control circuit 1255 use power it may receive power from the main power supply 1256 may provide operating power to the storage device 1247a and/or to charge power device 1247b. The power control circuit 1255 may notify a system (e.g., a motherboard, a BMC, and/or the like) that the power device 1247b has reached a charge state (e.g., fully charged), for example, using a battery status signal such as the Battery_Status signals illustrated in FIG. 10 and/or FIG. 11. In some embodiments, the power device 1247b may be considered fully charged at a charge level at which the power device 1247b may provide sufficient power to the storage device 1247a to enable the storage device 1247a to operate as a persistent memory (e.g., sufficient to power to enable the storage device 1247a to receive flush data, to maintain flush data (e.g., based on a state of a flush complete signal), and/or to perform an internal flush operation to flush data from volatile memory to storage media. Based on a power loss, for example, based on the system power (e.g., the main power source 1256) being turned off, a facility power outage, and/or the like, the power control circuit 1255 may supply power from the power device 1247b to the storage device 1247a. In some embodiments, based on detecting a power loss, the storage device 1247a may perform one or more operations in based on receiving a data flush completion signal from the system, for example, moving some or all data from volatile memory to storage media. Depending on the implementation details, based on a system power loss, a battery status output from the power control circuit 1255 may be ignored (e.g., by the storage device 1247a), reported (e.g., to a system (e.g., a motherboard, a BMC, and/or the like), and/or processed in any other manner.

Figure 13:
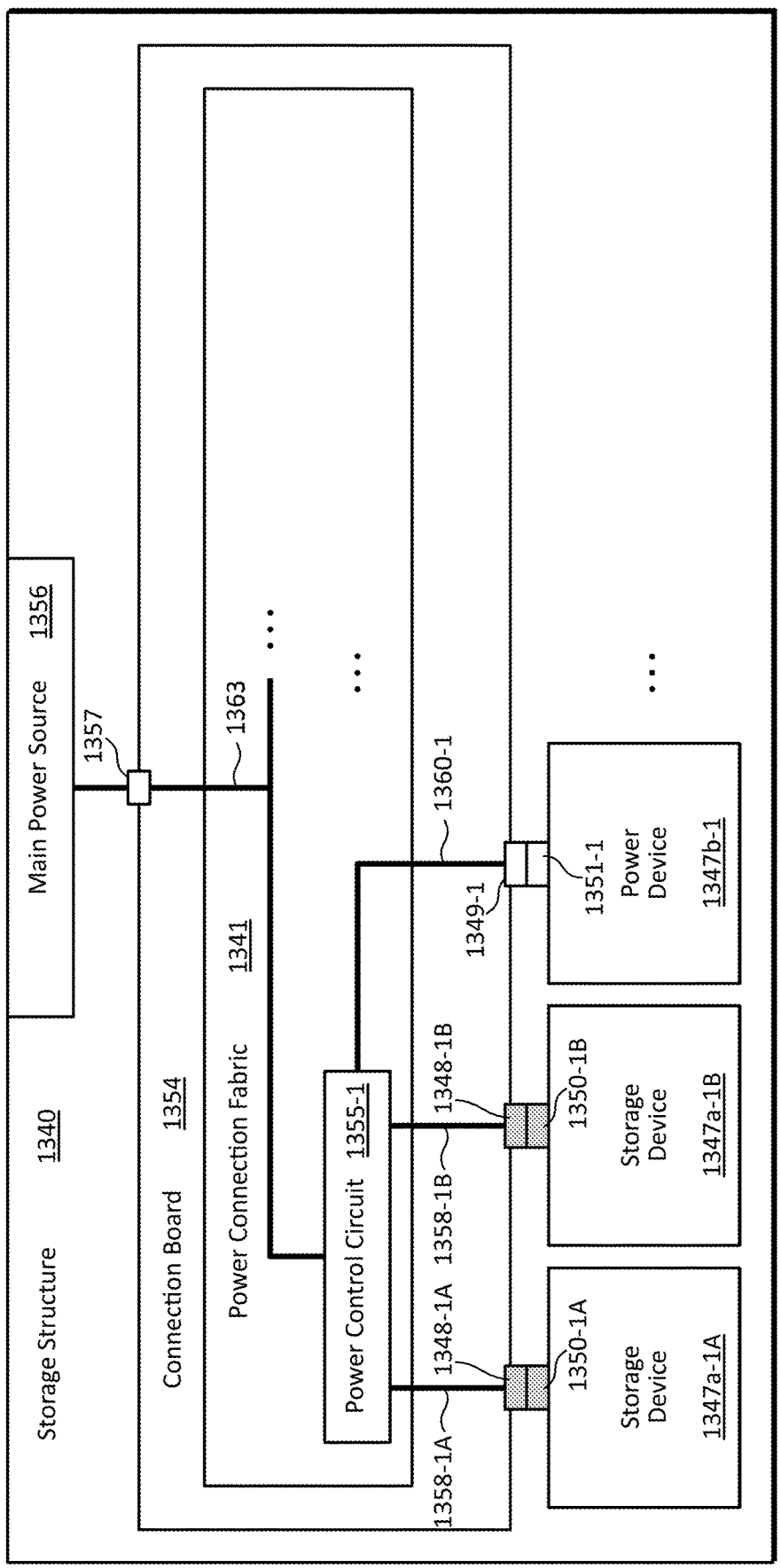
FIG. 13 illustrates an example embodiment of storage system having a second configuration in accordance with example embodiments of the disclosure.

FIG. 13 illustrates an example embodiment of storage system having a second configuration in accordance with example embodiments of the disclosure. The embodiment illustrated in FIG. 13 may include some elements similar to those illustrated in FIG. 12 in which similar elements may have reference numbers ending in similar digits. However, in the embodiment illustrated in FIG. 13, a power group may include a first storage device 1347a-1A, a second storage device 1347a-1B, a power device 1347b-1, and a power control circuit 1355-1. A power connection fabric 1341 in the storage structure 1340 may include a connection 1358-1A that may connect the power control circuit 1355-1 to the first storage device 1347a-1A (e.g., through connectors 1348-1A and/or 1350-1A) and a connection 1358-1B that may connect the power control circuit 1355-1 to the second storage device 1347a-1B (e.g., through connectors 1348-1B and/or 1350-1B).

Any of the storage devices 1347a, power devices 1347b, and/or corresponding device slots may be implemented with one or more common form factors based on one or more device dimensions such as width, height, length, and/or the like.

In some embodiments, the operation of the power control circuit 1355-1 may be similar to the power control circuit 1255-1 illustrated in FIG. 12, however, the power control circuit 1355-1 may provide power to either or both of the first storage device 1347a-1A and/or second storage device 1347a-1B from the main power source 1356 during normal operation and from the power device 1347b-1 based on detecting a loss of power from the main power source 1356.

In the embodiment illustrated in FIG. 13, as well as any other embodiments in which power (e.g., backup power) may be provided to one or more storage devices, delivery of power to different storage devices may be prioritized. For example, in some embodiments, delivery of power to one or more storage devices may be prioritized based on one or more configurations (e.g., user settings, administrator settings, and/or the like), an order of installation of storage devices in a storage structure, a pattern of power usage by one or more devices, information that may be received by the power control circuit 1355-1 from one or more storage devices 1347a, one or more power devices 1347b, and/or the like, regarding, for example, a type and/or amount of data to be flushed to the one or more storage devices 1347a, and/or the like.

In some embodiments, power provided to the storage devices 1347a-1A and/or 1347a-1B from the power device 1347b-1 may enable one or more of the storage devices 1347a-1A and/or 1347a-1B to control (e.g., delay) a flush operation based, for example, on a flush complete signal received from a system (e.g., a motherboard, a BMC, and/or the like).

Figure 14:
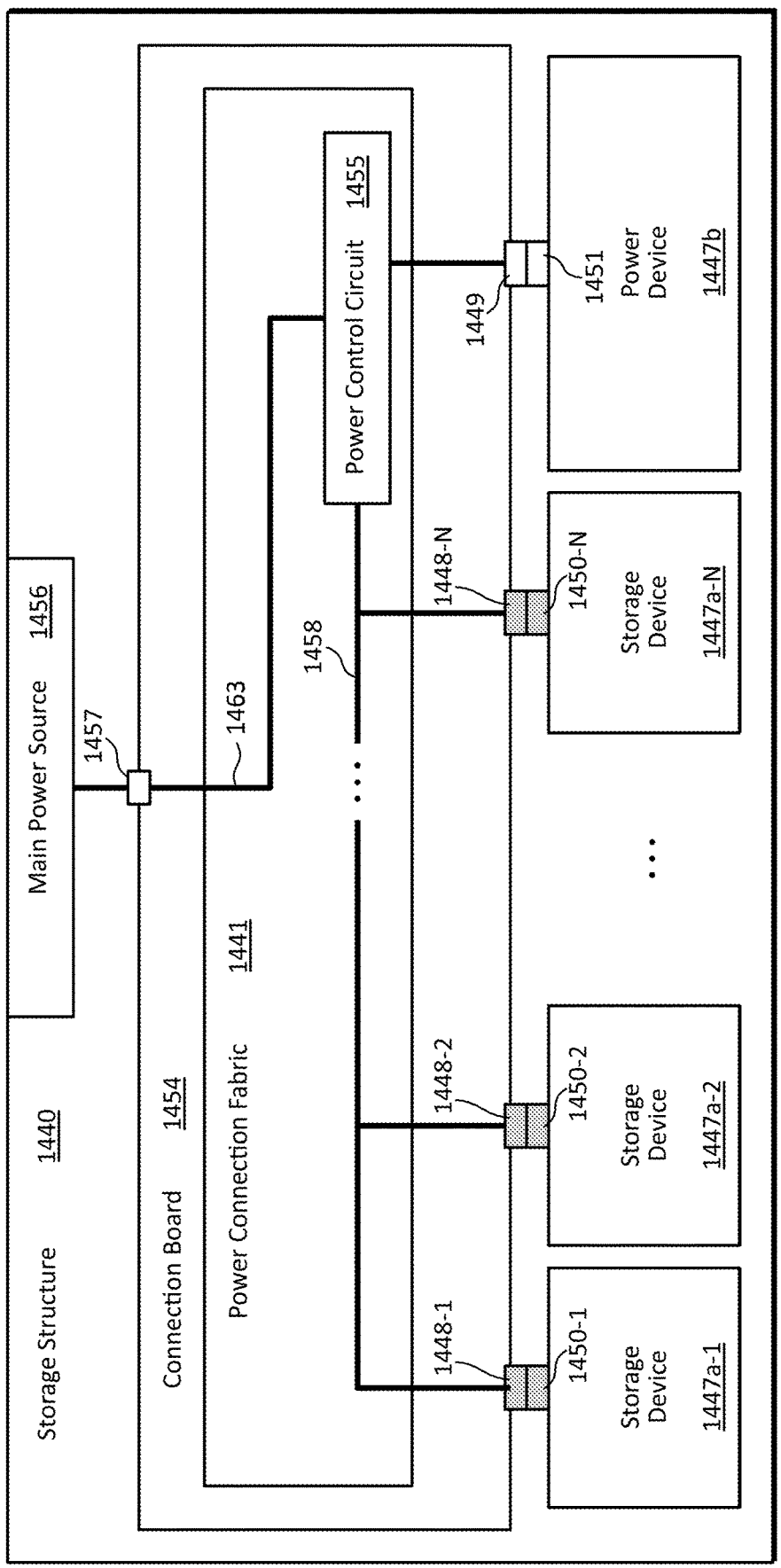
FIG. 14 illustrates an example embodiment of storage system having a third configuration in accordance with example embodiments of the disclosure.

FIG. 14 illustrates an example embodiment of storage system having a third configuration in accordance with example embodiments of the disclosure. The embodiment illustrated in FIG. 14 may include some elements similar to those illustrated in FIG. 13 in which similar elements may have reference numbers ending in similar digits. However, in the embodiment illustrated in FIG. 14, the storage system 1440 may include a power connection fabric 1441 in which a connection 1458 may connect the power control circuit 1455 to any number of storage devices 1447a-1 through 1447a-N (e.g., through connectors 1448-1 through 1448-N and/or 1450-1 through 1450-N).

Any of the storage devices 1447a, power devices 1447b, and/or corresponding device slots may be implemented with one or more common form factors based on one or more device dimensions such as width, height, length, and/or the like.

In some embodiments, the power device 1447b may have a relatively large power supply capacity to enable the power device 1447b to provide backup power to the storage devices 1447a-1 through 1447a-N, for example, long enough to enable the storage devices 1447a-1 through 1447a-N to wait to receive flush data, perform internal data flush operations, and/or the like. For example, in some embodiments, the power device 1447b may be implemented as a double-width device, a quad-width device, and/or the like, to provide enough space to accommodate relatively large batteries, supercapacitors, tantalum capacitors, and/or the like.

In some embodiments, power provided to the storage devices 1447a-1 through 1447a-N from the power device 1447b may enable one or more of the storage devices 1447a-1 through 1447a-N to control (e.g., delay) a flush operation based, for example, on a flush complete signal received from a system (e.g., a motherboard, a BMC, and/or the like).

Figure 15:
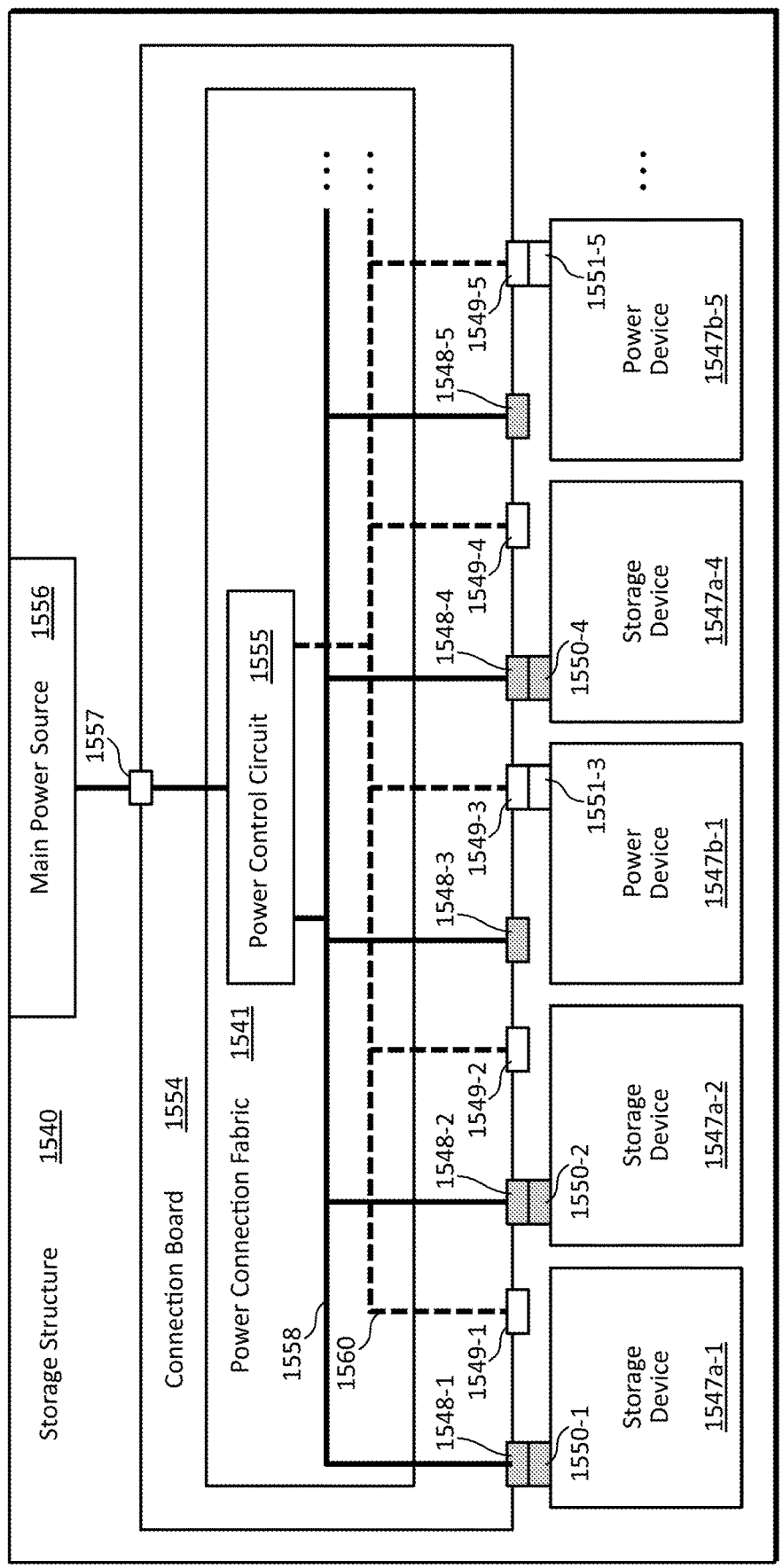
FIG. 15 illustrates an example embodiment of storage system having a fourth configuration in accordance with example embodiments of the disclosure.

FIG. 15 illustrates an example embodiment of storage system having a fourth configuration in accordance with example embodiments of the disclosure. The embodiment illustrated in FIG. 15 may include some elements similar to those illustrated in FIG. 14 in which similar elements may have reference numbers ending in similar digits. However, in the embodiment illustrated in FIG. 15, the storage system 1540 may include a power connection fabric 1541 having a first bus connection 1558 and a second bus connection 1560 (shown as a dashed line to distinguish it from the first bus connection 1558). The first bus connection 1558 may connect the power control circuit 1555 to connectors 1548-1 through 1548-N for one or more slots (e.g., each slot) of the storage structure 1540. The second bus connection 1560 may connect the power control circuit 1555 to connectors 1549-1 through 1549-M for one or more slots (e.g., each slot) of the storage structure 1540.

In some embodiments, one or more slots (e.g., each slot) of the storage structure may have an associated connector for a storage device 1547*a* and an associated connector a power device 1547*b*. Depending on the implementation details, this may provide a flexible system in which one or more slots (e.g., each slot) may receive either a storage device 1547*a* or a power device 1547*b*. Thus, the storage structure 1540 may be configured and/or reconfigured (e.g., by a system administrator) with any combination of storage devices 1547*a* and/or power devices 1547*b*. For example, the overall storage capacity of the storage structure 1540 may be expanded by adding a storage device 1547*a* to any available slot. As another example, the overall backup power capacity of the storage structure 1540 may be expanded by adding a power device 1547*b* to any available slot (or portion thereof, for example, if adding a half-width power device 1547*b*) or group of adjacent available slots (for example, if adding a double width power device 1547*b*, quad-width power device and/or the like).

Additionally, or alternatively, the power connection fabric 1541 may be implemented with one or more individual connections between the power control circuit 1555 and any of the storage device 1547*a* and/or between the power control circuit 1555 and any of the power devices 1547*b*. For example, in some embodiments, the first bus connection 1558 may be replaced by individual connections between the power control circuit 1555 and each of the connectors 1548-1 through 1548-N. Such an embodiment may enable the power control circuit 1555 to receive aggregated power from one or more (e.g., all) of the power devices 1547*b*, while managing power (e.g., providing backup power) to each storage device 1547*a* individually.

Any of the storage devices 1547*a*, power devices 1547*b*, and/or corresponding device slots may be implemented with one or more common form factors based on one or more device dimensions such as width, height, length, and/or the like.

Figure 16:
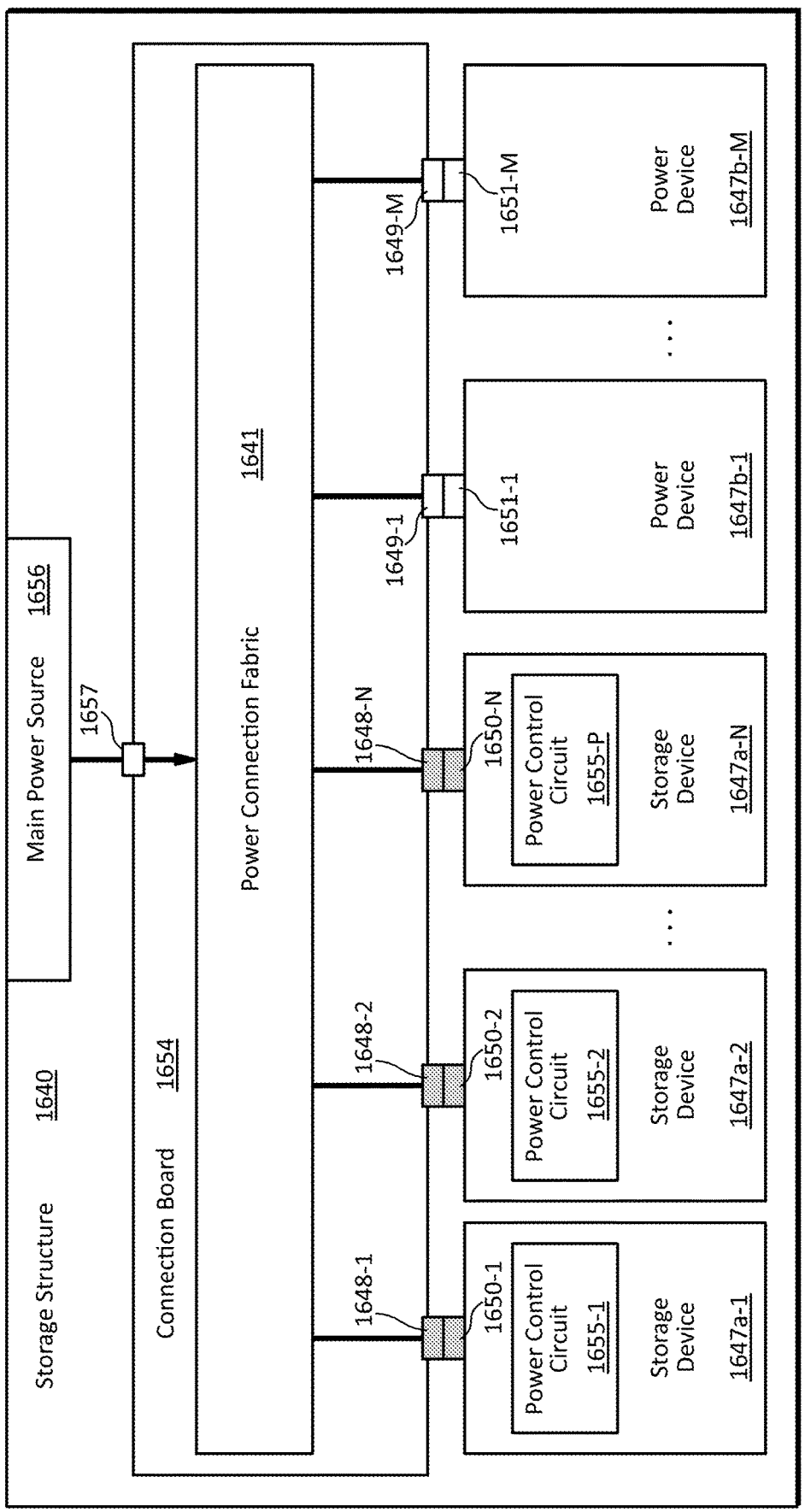
FIG. 16 illustrates a third embodiment of a storage system having a power control circuit in accordance with example embodiments of the disclosure.

FIG. 16 illustrates a third embodiment of a storage system having a power control circuit in accordance with example embodiments of the disclosure. The embodiment illustrated in FIG. 16 may include some elements similar to those illustrated in FIG. 8 in which similar elements may have reference numbers ending in similar digits. However, in the embodiment illustrated in FIG. 16, one or more power control circuits 1655-1, . . . 1655-P may be located at least partially at one or more storage devices 1647*a*-1, . . . , 1647*a*-N. In such an embodiment, the one or more of the power control circuits 1655 may enable one or more of the storage devices 1647*a* to implement one or more features such as charging one or more of the power devices 1647*b* (e.g., using power from a main power source 1656 and/or from one or more of the storage devices 1647*a*, and/or the like), monitoring a charge state of one or more of the power devices 1647*b*, sending information about a charge state of one or more of the power devices 1647*b* (e.g., to a storage system), and/or transferring power (e.g., backup power) from one or more of the power devices 1647*b* to one or more of the storage devices 1647*a*.

Figure 17A:
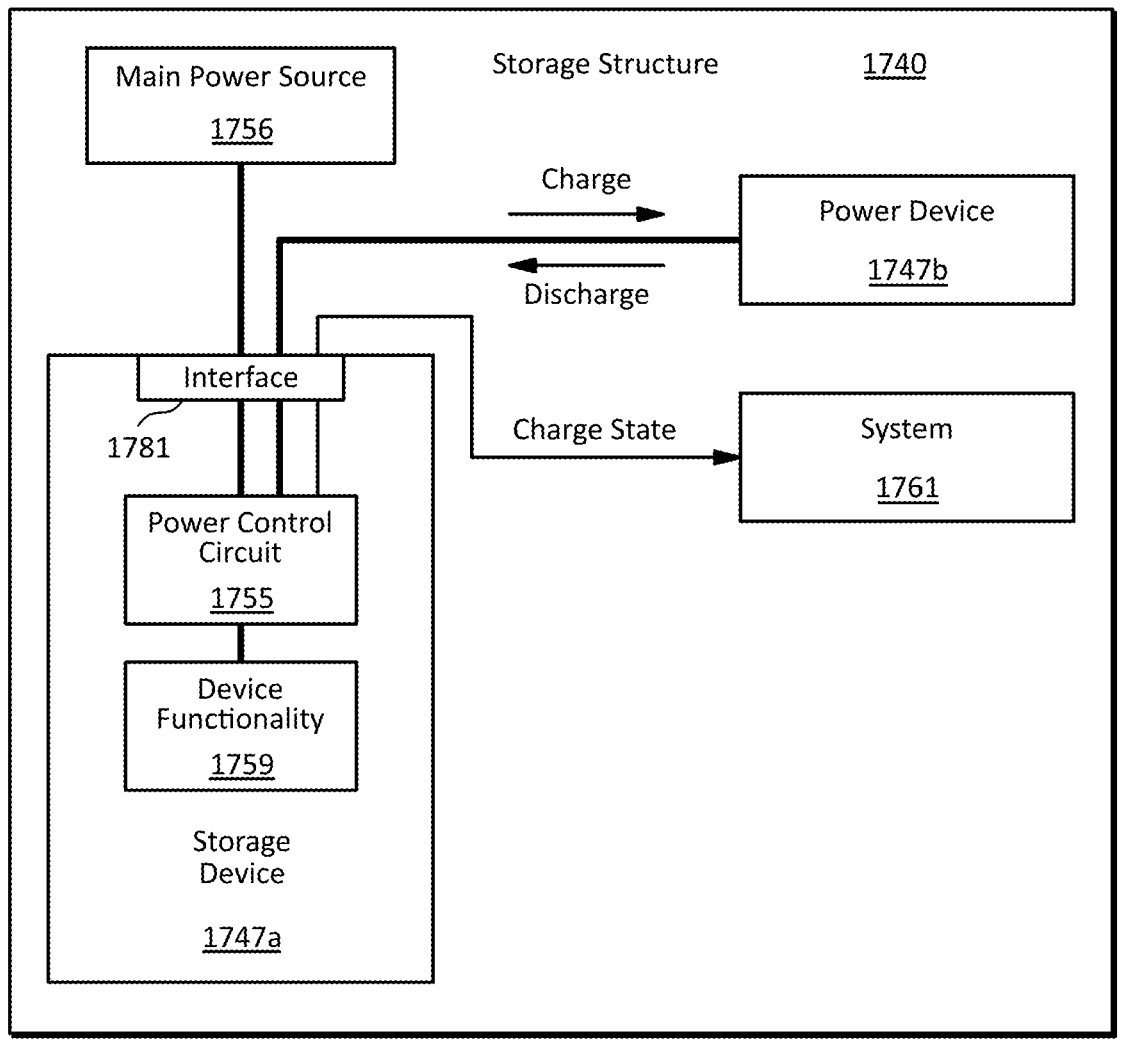
FIG. 17A illustrates a first example embodiment of a third scheme for providing power to a storage device in accordance with example embodiments of the disclosure.

FIG. 17A illustrates a first example embodiment of a third scheme for providing power to a storage device in accordance with example embodiments of the disclosure. The embodiment illustrated in FIG. 17A may be used, for example, with any of the embodiments illustrated in FIG. 16, FIG. 18, and/or any embodiment in which a power control circuit may be located at least partially at a storage device. The embodiment illustrated in FIG. 17A may include some elements similar to those illustrated in FIG. 10 and/or FIG. 11 in which similar elements may have reference numbers ending in similar digits. However, in the embodiment illustrated in FIG. 17A, a power control circuit 1755 may be located at least partially at a storage device 1747*a*. In such an embodiment, the power control circuit 1755 may enable the storage device 1747*a* to implement one or more features such as charging the power device 1747*b* (e.g., using power from a main power source 1756 and/or from the storage device 1747*a*, and/or the like), monitoring a charge state of the power device 1747*b*, sending information about a charge state of the power device 1747*b* to a storage system (e.g., a motherboard, CPU, BMC, and/or the like), and/or transferring power (e.g., backup power) from the power device 1747*b* to the storage device 1747*a*.

In some embodiments, one or more of the connections between the storage device 1747*a* and the main power source 1756, the power device 1747*b*, the system 1761, and/or the like, may be implemented with an interface 1781 which may be similar, for example, to the interface 481-1 illustrated in FIG. 4C and/or FIG. 4D.

The storage device 1747*a* may further include device functionality 1759 that may include, for example, storage media, one or more communication interfaces (which may include, for example, a storage interface such as SATA, SAS, PCIe, Ethernet and/or the like that may use any protocol such as NVMe, CXL, and/or the like) one or more controllers (e.g., a flash translation layer (FTL), and/or the like), compute resources, and/or the like. Alternatively, or additionally, in some embodiments, the storage device 1747*a* may be implemented as a different type of device such as an accelerator, graphics processing unit (GPU), data processing unit (DPU), neural processing unit (NPU), tensor processing unit (TPU), memory buffer device, cache memory device, memory expansion device, network interface card (NIC), and/or the like, or any combination thereof.

Figure 17B:
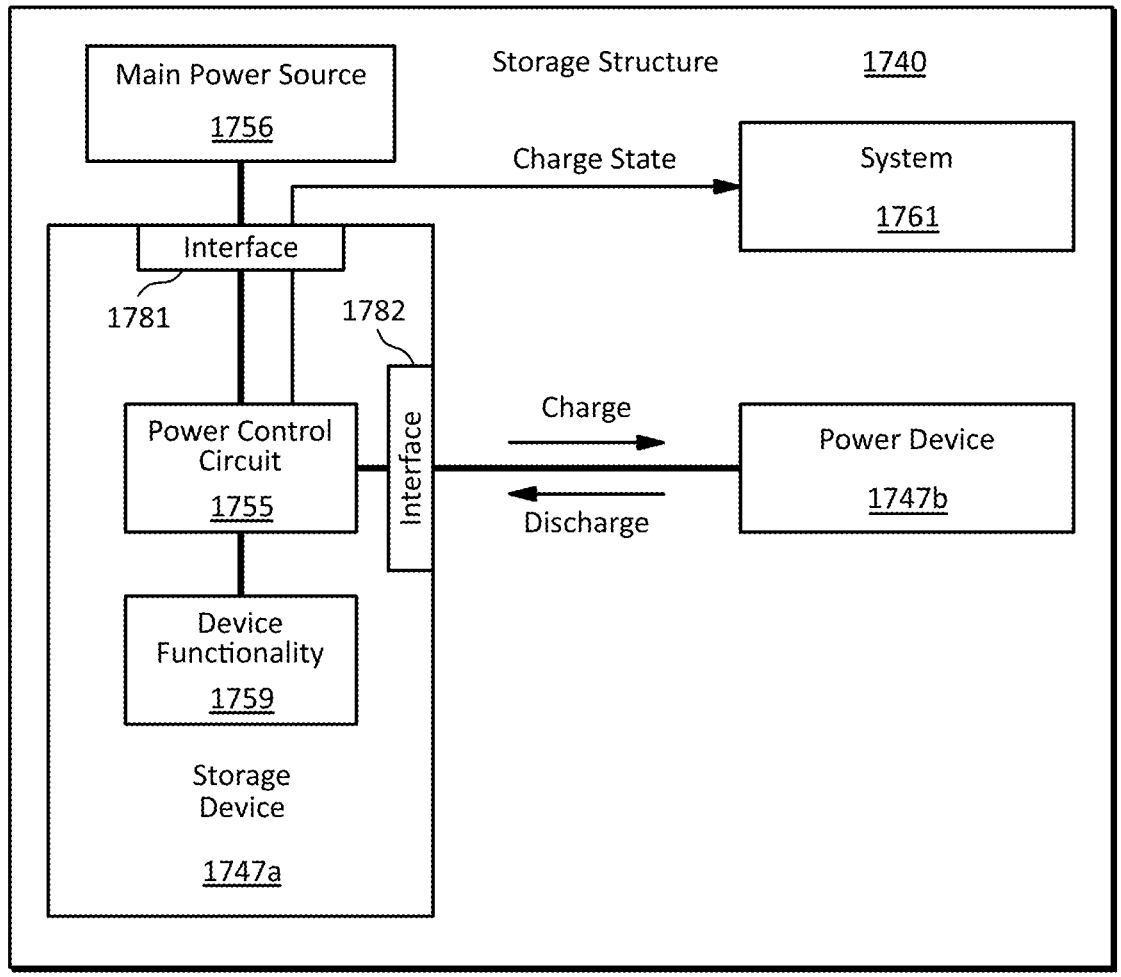
FIG. 17B illustrates a second example embodiment of a third scheme for providing power to a storage device in accordance with example embodiments of the disclosure.

FIG. 17B illustrates a second example embodiment of a third scheme for providing power to a storage device in accordance with example embodiments of the disclosure. The embodiment illustrated in FIG. 17B may include some elements similar to those illustrated in FIG. 17A in which similar elements may have reference numbers ending in similar digits. However, in the embodiment illustrated in FIG. 17B, one or more of the connections between the storage device 1747*a* and the main power source 1756, the power device 1747*b*, the system 1761, and/or the like, may be implemented with a first interface 1781 and/or a second interface 1782, which may be similar, for example, to the first interface 481-1 and/or second interface 482-1 illustrated in FIG. 4D. For example, as illustrated in FIG. 17B, one or more connections between the storage device 1747*a* and the main power source 1756 and/or the system 1761 may be implemented with the first interface 1781, and one or more connections between the storage device 1747*a* and a power device 1747*b* may be implemented with the second interface 1782.

Figure 18:
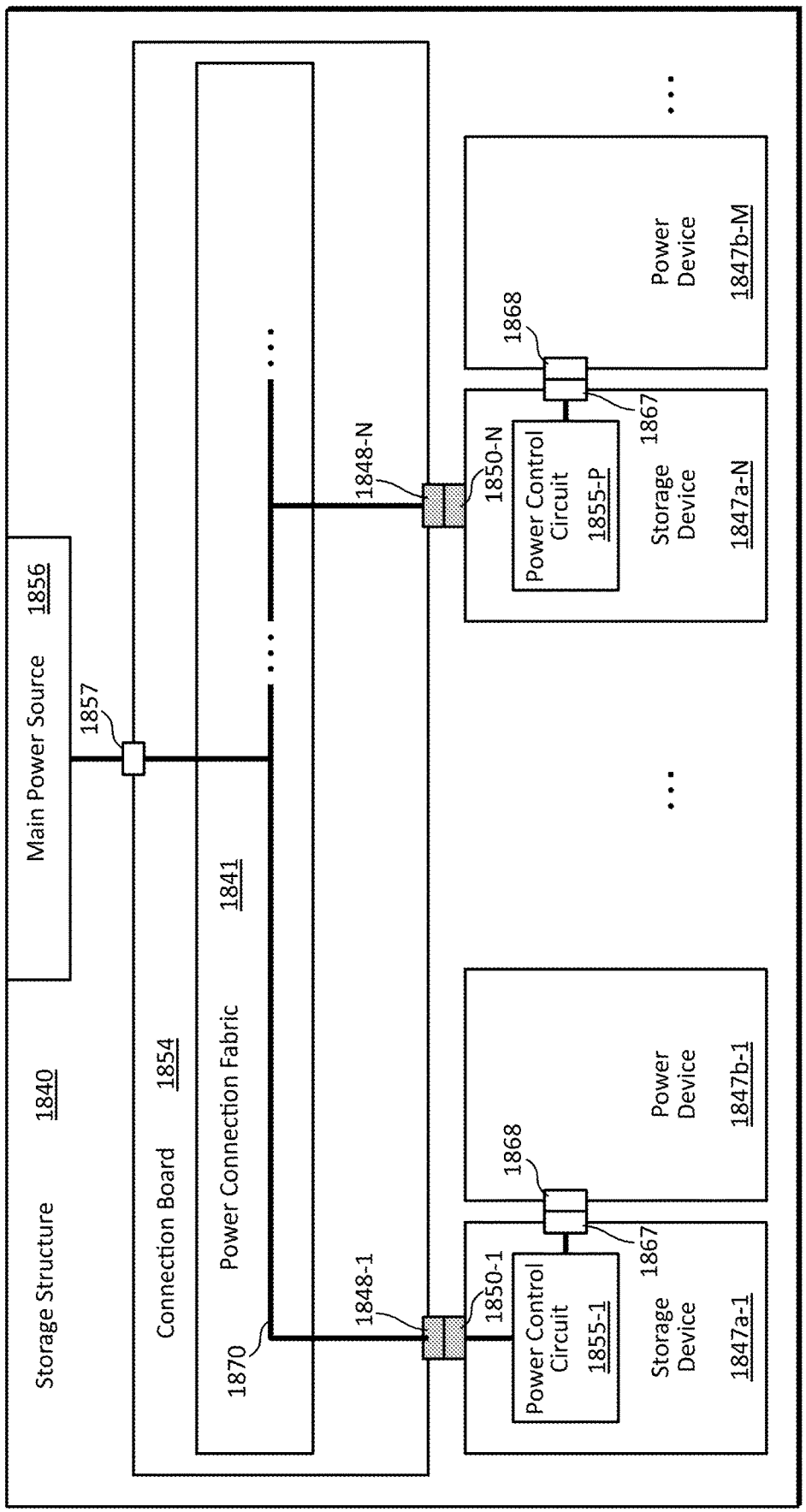
FIG. 18 illustrates an example embodiment of storage system having a fifth configuration in accordance with example embodiments of the disclosure.

FIG. 18 illustrates an example embodiment of storage system having a fifth configuration in accordance with example embodiments of the disclosure. The embodiment illustrated in FIG. 18 may include some elements similar to those illustrated in FIG. 16 in which similar elements may have reference numbers ending in similar digits. However, in the embodiment illustrated in FIG. 18, a storage device 1847*a*-1, which may include a power control circuit 1855-1, may be connected to a power device 1847*b*-1 to enable power to be transferred, at least partially, between the storage device 1847*a*-1 and the power device 1847*b*-1 (e.g., directly between the storage device 1847*a*-1 and the power device 1847*b*-1). In such an embodiment, a power connection fabric may be implemented with a power connection 1870 that may connect the main power source 1856 to one or more storage devices 1847*a*-1, . . . , 1847*a*-N.

One or more power control circuits 1855-1, . . . , 1855-P may be located at least partially at one or more of the storage devices 1847*a*-1, . . . , 1847*a*-N. A power control circuit 1855 may implement one or more features such as charging the power device 1847*b* (e.g., using power from a main power source 1856 and/or from the storage device 1847*a*, and/or the like), monitoring a charge state of the power device 1847*b*, sending information about a charge state of the power device 1847*b* to a storage system (e.g., a motherboard, CPU, BMC, and/or the like), and/or transferring power (e.g., backup power) from the power device 1847*b* to the storage device 1847*a*.

In some embodiments, a connection between the storage device 1847*a*-1 and the power device 1847*b*-1 may be implemented using a connection similar to the connection 553 illustrated in FIG. 5. For example, in some embodiments, a first connector 1867 on the storage device 1847*a*-1, which may be installed in a first slot, may engage a second connector 1868 on the power device 1847*b* installed in a second slot adjacent slot to the first slot. Alternatively, or additionally, one or more cables, wires, and/or the like may be used to implement a connection between the storage device 1847*a*-1 and the power device 1847*b*-1 which, depending on the implementation details, may be located in slots that are not adjacent as shown, for example, in FIG. 5. In some embodiments, a connection between a storage device 1847*a* and a power device 1847*b* may be considered part of a power connection fabric.

A power control circuit 1855 may be located in one or more of the storage devices 1847*a*. A power control circuit 1855 located at a storage device 1847*a* may enable a storage device 1847*a* at which it is located to implement one or more features such as charging one or more power devices 1847*b* to which it may be connected (e.g., using power from the main power source 1856), monitoring a charge state of one or more power devices 1847*b* to which it may be connected, sending information about a charge state of one or more power devices 1847*b* to which it may be connected (e.g., to a storage system and/or component thereof such as a motherboard, a BMC, and/or the like), and/or transferring power (e.g., backup power) from one or more power devices 1847*b* to which it may be connected to one or more of the storage devices 1847*a*.

Any embodiments of storage structures disclosed herein, any storage devices, power devices, and/or corresponding device slots may be implemented with one or more common form factors based on one or more device dimensions such as width, height, length, and/or the like.

Figure 19:
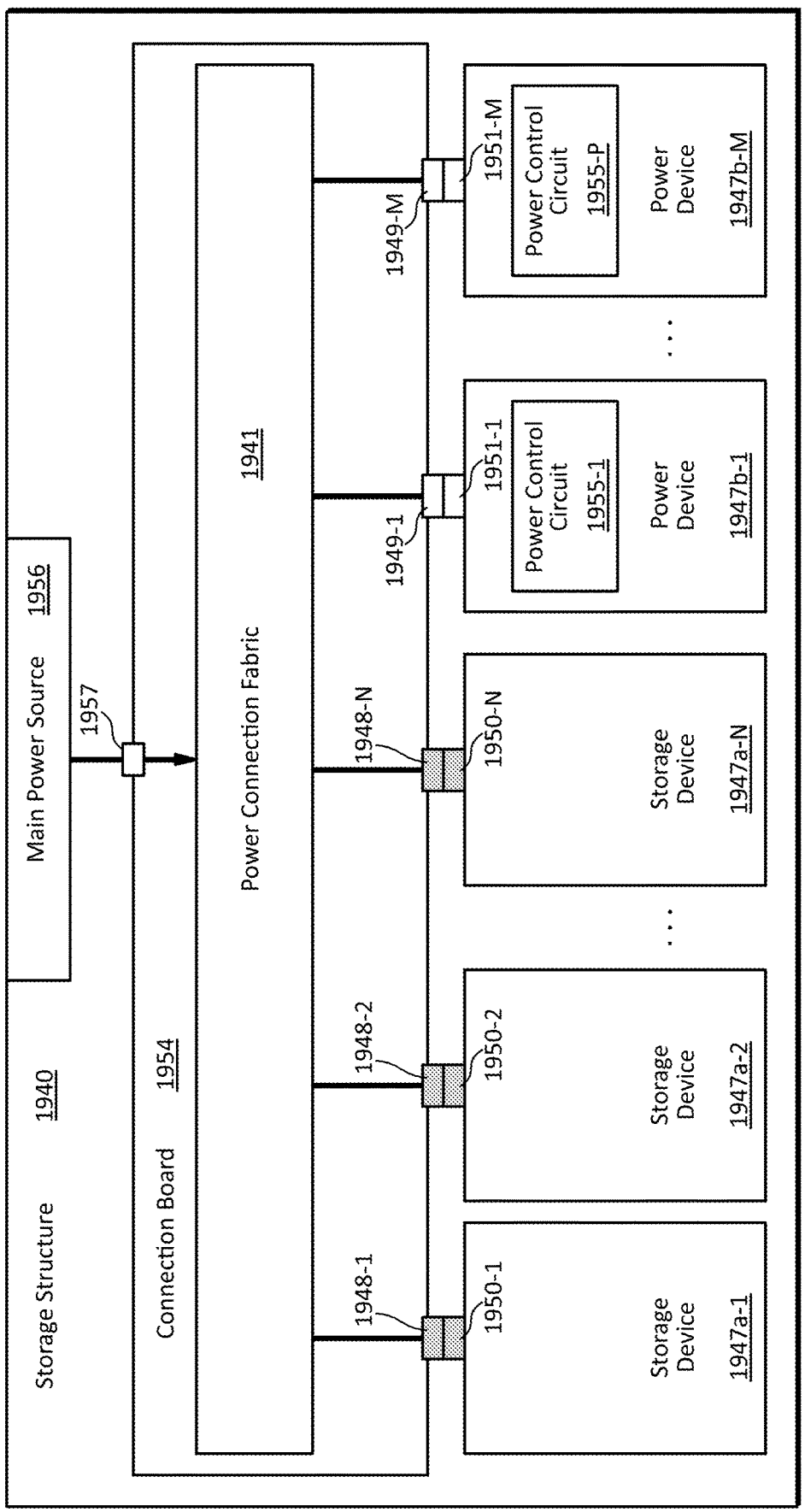
FIG. 19 illustrates a fourth embodiment of a storage system having a power control circuit in accordance with example embodiments of the disclosure.

FIG. 19 illustrates a fourth embodiment of a storage system having a power control circuit in accordance with example embodiments of the disclosure. The embodiment illustrated in FIG. 19 may include some elements similar to those illustrated in FIG. 16 in which similar elements may have reference numbers ending in similar digits. However, in the embodiment illustrated in FIG. 19, one or more power control circuits 1955-1, . . . 1955-P may be located at least partially at one or more power devices 1947*b*-1, . . . , 1947*b*-M. In such an embodiment, one or more of the power control circuits 1955 may enable one or more of the power devices 1947*a* to implement one or more features such as charging one or more of the power devices 1947*b* (e.g., using power from a main power source 1956 and/or from one or more of the storage devices 1947*a*, and/or the like), monitoring a charge state of one or more of the power devices 1947*b*, sending information about a charge state of one or more of the power devices 1947*b* (e.g., to a storage system, a storage device 1947*a*, and/or the like), and/or transferring power (e.g., backup power) from one or more of the power devices 1947*b* to one or more of the storage devices 1947*a*.

Figure 20A:
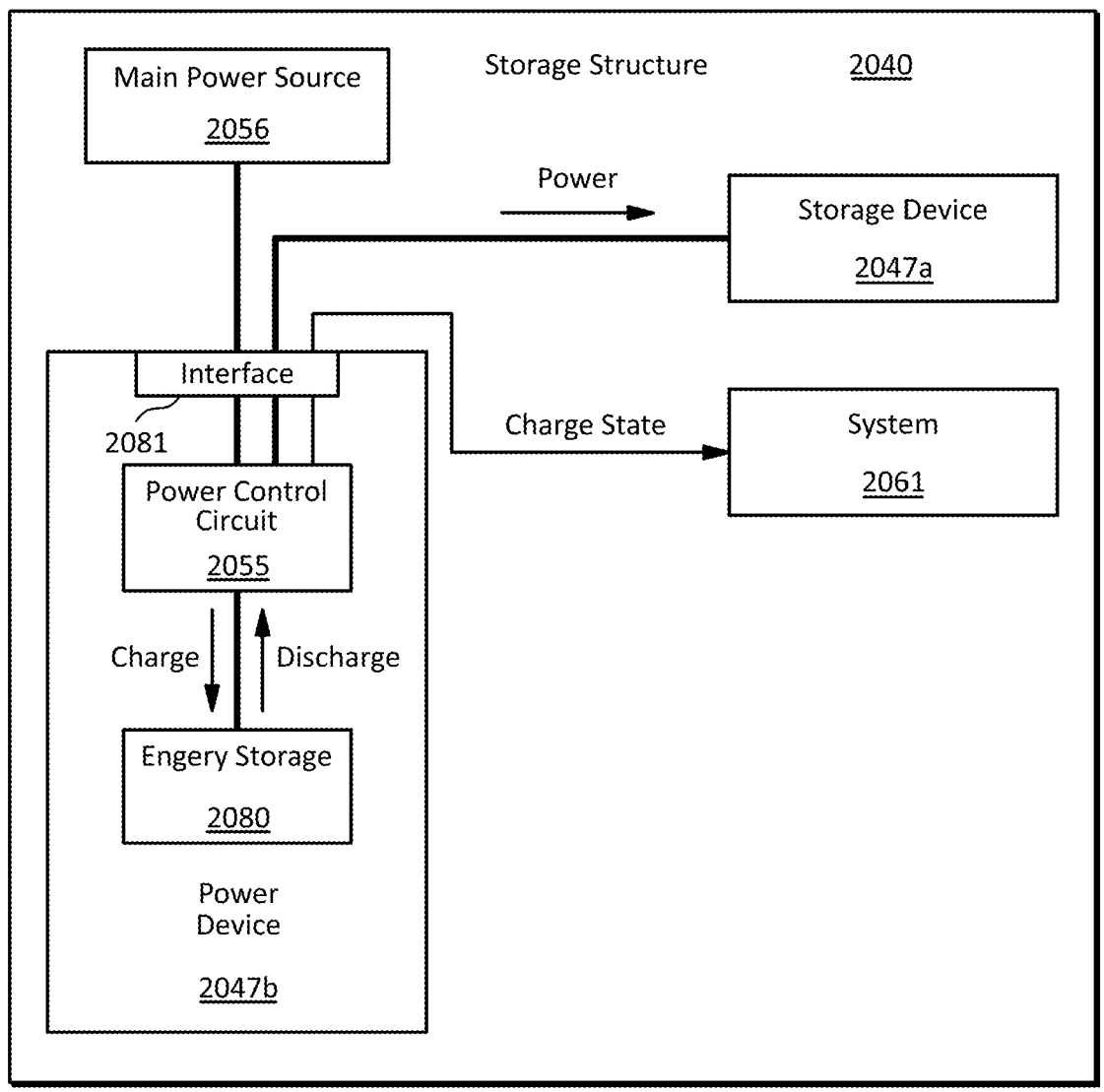
FIG. 20A illustrates a first example embodiment of a fourth scheme for providing power to a storage device in accordance with example embodiments of the disclosure.

FIG. 20A illustrates a first example embodiment of a fourth scheme for providing power to a storage device in accordance with example embodiments of the disclosure. The embodiment illustrated in FIG. 20A may be used, for example, with any of the embodiments illustrated in FIG. 19, FIG. 21, FIG. 22, and/or any embodiment in which a power control circuit may be located at least partially at a power device. The embodiment illustrated in FIG. 20A may include some elements similar to those illustrated in FIG. 10, FIG. 11, FIG. 17A, and/or FIG. 17B in which similar elements may have reference numbers ending in similar digits. However, in the embodiment illustrated in FIG. 20A, a power control circuit 2055 may be located at least partially at a power device 2047*b*. In such an embodiment, the power control circuit 2055 may enable the power device 2047*b* to implement one or more features such as charging the power device 2047*b* (e.g., using power from a main power source 2056 and/or from a storage device 2047*a*, and/or the like to charge one or more energy storage elements 2080), monitoring a charge state of the power device 2047*b*, sending information about a charge state of the power device 2047*b* (e.g., to a storage system which may be implemented with a motherboard, CPU, BMC, and/or the like, to a storage device 2047*a*, and/or the like) and/or transferring power (e.g., backup power) from the power device 2047*b* to a storage device 2047*a*.

In some embodiments, one or more of the connections between the power device 2047*b* and the main power source 2056, the storage device 2047*a*, the system 2061, and/or the like, may be implemented with an interface 2081 which may be similar, for example, to the interface 481-2 illustrated in FIG. 4C and/or FIG. 4D.

Figure 20B:
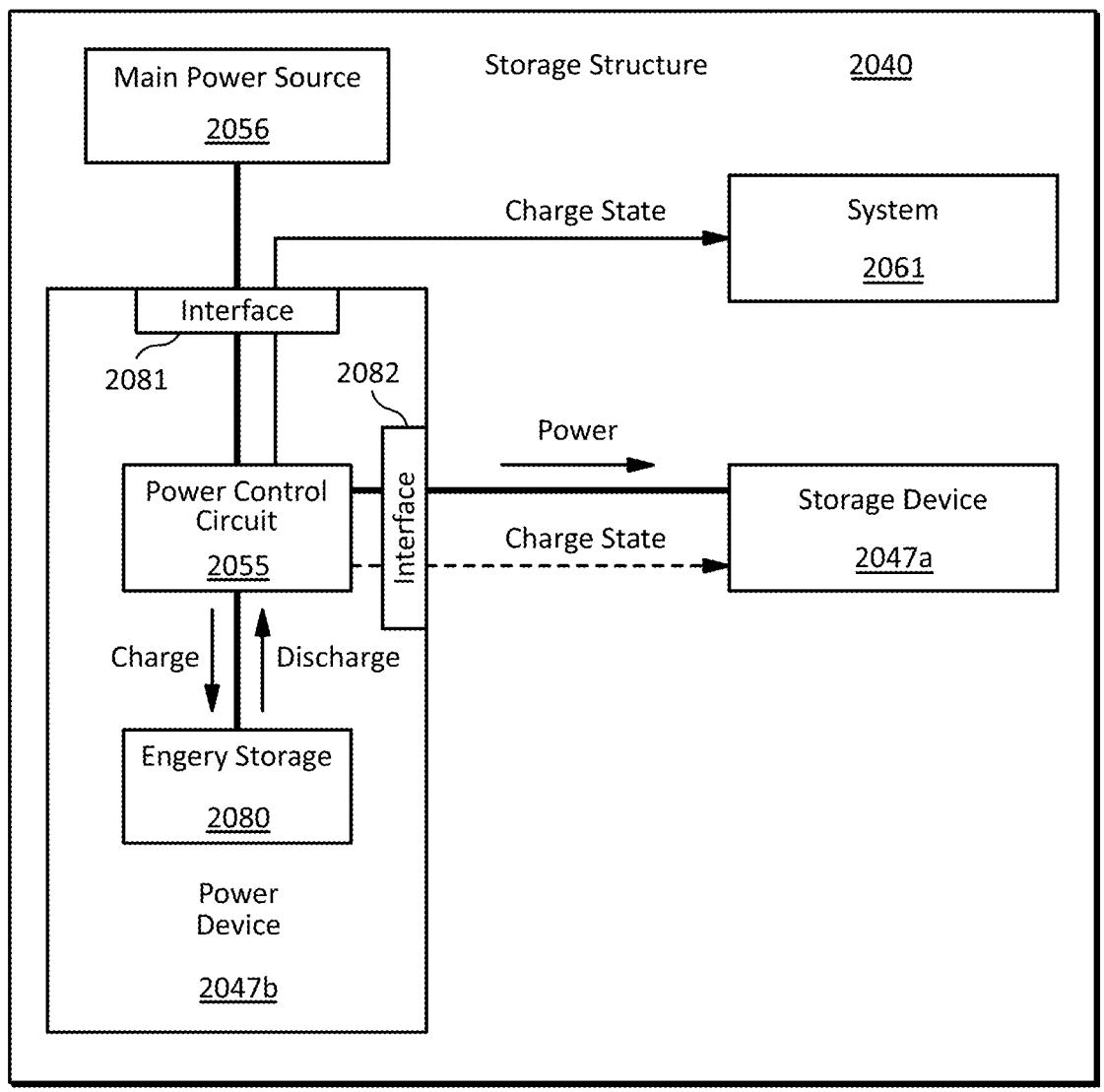
FIG. 20B illustrates a second example embodiment of a fourth scheme for providing power to a storage device in accordance with example embodiments of the disclosure.

FIG. 20B illustrates a second example embodiment of a fourth scheme for providing power to a storage device in accordance with example embodiments of the disclosure. The embodiment illustrated in FIG. 20B may include some elements similar to those illustrated in FIG. 20A in which similar elements may have reference numbers ending in similar digits. However, in the embodiment illustrated in FIG. 20B, one or more of the connections between the power device 2047*b* and the main power source 2056, the storage device 2047*a*, the system 2061, and/or the like, may be implemented with a first interface 2081 and/or a second interface 2082, which may be similar, for example, to the first interface 481-2 and/or the second interface 482-2 illustrated in FIG. 4D. For example, as illustrated in FIG. 20B, one or more connections between the power device 2047*b* and the main power source 2056 and/or the system 2061 may be implemented with the first interface 2081, and one or more connections between the power device 2047*a* and a storage device 2047*a* may be implemented with the second interface 1782.

Figure 21:
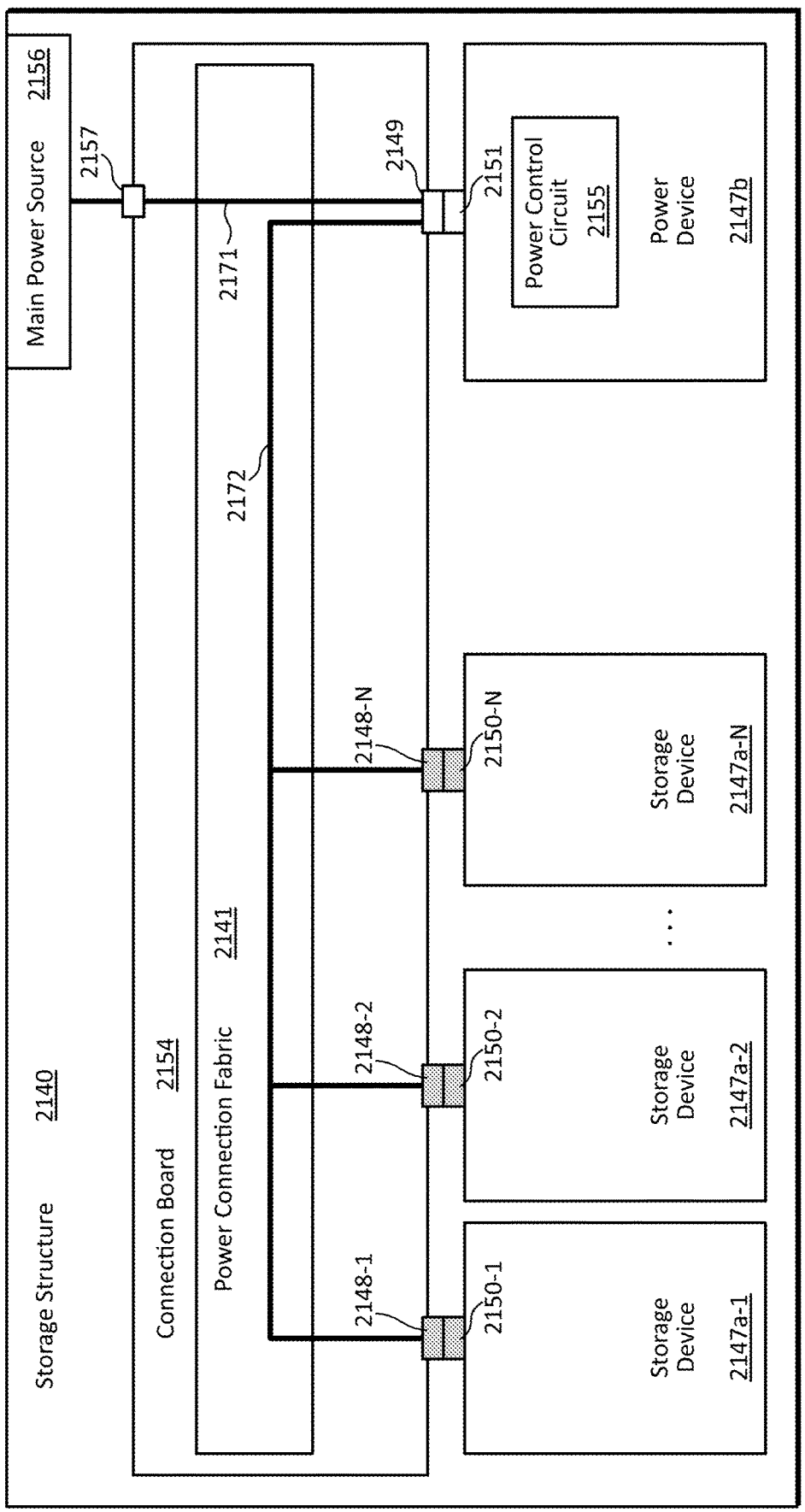
FIG. 21 illustrates an example embodiment of storage system having a sixth configuration in accordance with example embodiments of the disclosure.

FIG. 21 illustrates an example embodiment of storage system having a sixth configuration in accordance with example embodiments of the disclosure. The embodiment illustrated in FIG. 21 may include some elements similar to those illustrated in FIG. 18 in which similar elements may have reference numbers ending in similar digits. However, in the embodiment illustrated in FIG. 21, one or more power control circuits 2155 may be located at least partially at one or more power devices 2147b. A power connection fabric 2141 may be implemented with a first connection 2171 that may connect a main power source 2156 to one or more power devices 2147b and a second connection 2172 that may connect one or more power devices 2147b to one or more storage devices 2147a-1, . . . , 2174a-N.

A power control circuit 2155 may implement one or more features such as charging a power device 2147b (e.g., using power from a main power source 2156 and/or from a storage device 2147a, and/or the like), monitoring a charge state of a power device 2147b, sending information about a charge state of a power device 2147b (e.g., to a storage system that may include a motherboard, CPU, BMC, and/or the like, to a storage device 2147a, and/or the like), and/or transferring power (e.g., backup power) from a power device 2147b to a storage device 2147a.

In some embodiments, a power device 2147b may have a relatively large power supply capacity to enable the power device 2147b to provide backup power to one or more storage devices 2147a, for example, long enough to enable the one or more storage devices 2147a wait to receive flush data, perform internal data flush operations, and/or the like. For example, in some embodiments, a power device 2147b may be implemented as a double-width device, a quad-width device, and/or the like, to provide enough space to accommodate relatively large batteries, supercapacitors, tantalum capacitors, and/or the like.

Figure 22:
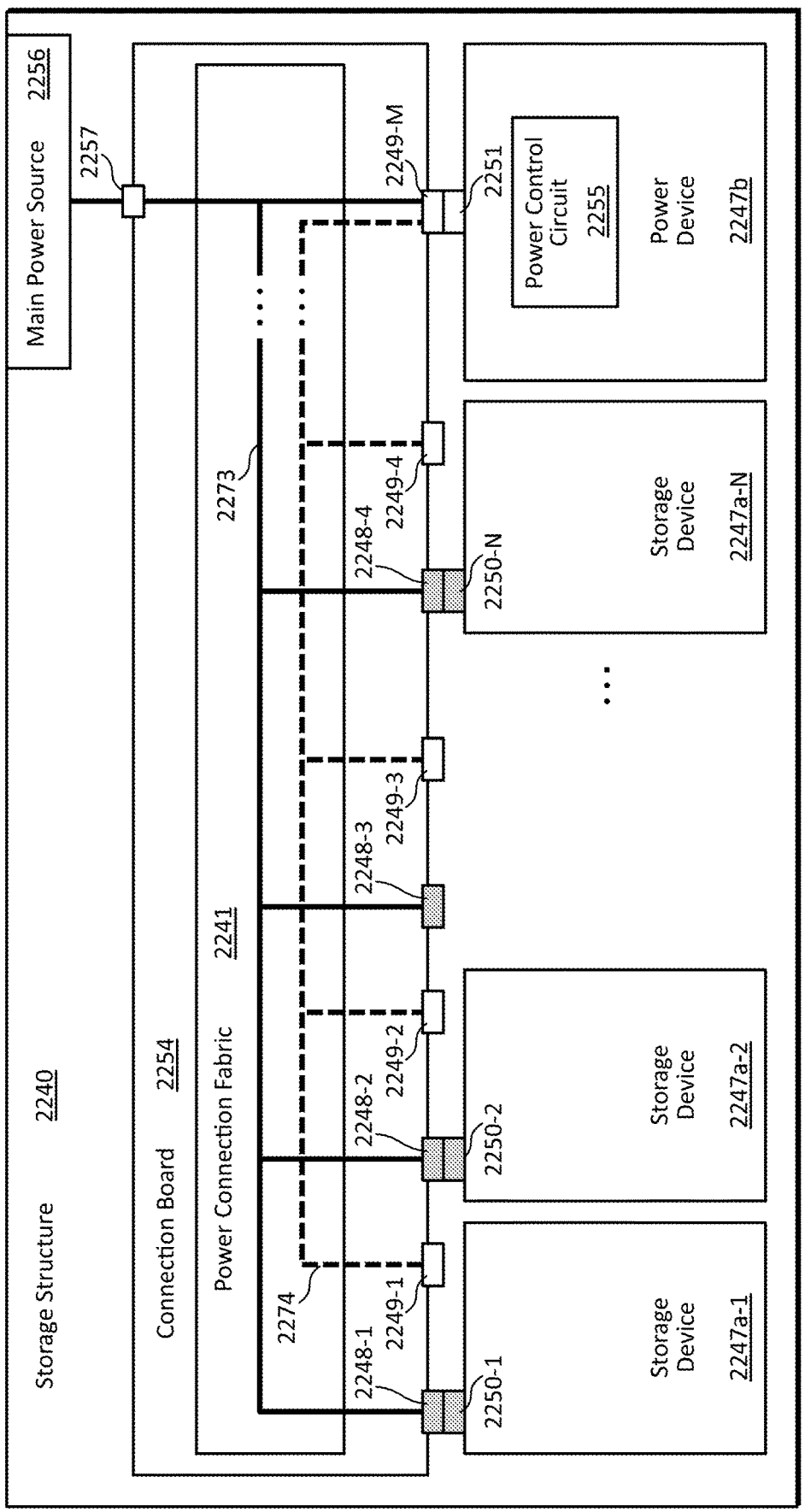
FIG. 22 illustrates an example embodiment of storage system having a seventh configuration in accordance with example embodiments of the disclosure.

FIG. 22 illustrates an example embodiment of storage system having a seventh configuration in accordance with example embodiments of the disclosure. The embodiment illustrated in FIG. 22 may include some elements similar to those illustrated in FIG. 21 in which similar elements may have reference numbers ending in similar digits. However, in the embodiment illustrated in FIG. 22, the storage system 2240 may include a power connection fabric 2241 having a first bus connection 2273 and a second bus connection 2274 (shown as a dashed line to distinguish it from the first bus connection 2273). The first bus connection 2273 may connect a main power source 2256 to connectors 2248-1 through 2248-N for one or more slots (e.g., each slot) of the storage structure 2240. The second bus connection 2274 may connect to one or more connectors 2250-1 through 2250-M for one or more slots (e.g., each slot) of the storage structure 2240.

In the embodiment illustrated in FIG. 22, one or more power control circuits 2255 may be located at least partially at one or more power devices 2147b. A power control circuit 2255 may implement one or more features such as charging a power device 2247b (e.g., using power from a main power source 2256 and/or from a storage device 2247a, and/or the like), monitoring a charge state of a power device 2247b, sending information about a charge state of a power device 2247b (e.g., to a storage system that may include a motherboard, CPU, BMC, and/or the like, to a storage device 2247a, and/or the like), and/or transferring power (e.g., backup power) from a power device 2247b to one or more storage devices 2247a.

In some embodiments, one or more slots (e.g., each slot) of the storage structure 2240 may have an associated connector for a storage device 2247a and an associated connector a power device 2247b. Depending on the implementation details, this may provide a flexible system in which one or more slots (e.g., each slot) may receive either a storage device 2247a or a power device 2247b. Thus, the storage structure 2240 may be configured and/or reconfigured (e.g., by a system administrator) with any combination of storage devices 2247a and/or power devices 2247b. For example, the overall storage capacity of the storage structure 2240 may be expanded by adding a storage device 2247a to any available slot. As another example, the overall backup power capacity of the storage structure 2240 may be expanded by adding a power device 2247b to any available slot (or portion thereof, for example, if adding a half-width power device 2247b) or group of adjacent available slots (for example, if adding a double width power device 2247b, quad-width power device and/or the like).

In some embodiments, a power device 2247b may have a relatively large power supply capacity to enable the power device 2247b to provide backup power to one or more storage devices 2247a, for example, long enough to enable the one or more storage devices 2247a wait to receive flush data, perform internal data flush operations, and/or the like. For example, in some embodiments, a power device 2247b may be implemented as a double-width device, a quad-width device, and/or the like, to provide enough space to accommodate relatively large batteries, supercapacitors, tantalum capacitors, and/or the like.

Additionally, or alternatively, the power connection fabric may be implemented with one or more individual connections between a power device 2247b and any of the storage devices 2247a. For example, in some embodiments, the second bus connection 2274 may be replaced by individual connections between the power device 2247b and each of the storage devices 2247a-1 through 2247a-N. Such an embodiment may enable the power control circuit 2255 to receive aggregated power the main power source 2256 and/or from one or more (e.g., all) of the power devices 2247b, while managing power (e.g., providing backup power) to each storage device 2247a individually.

Figure 23:
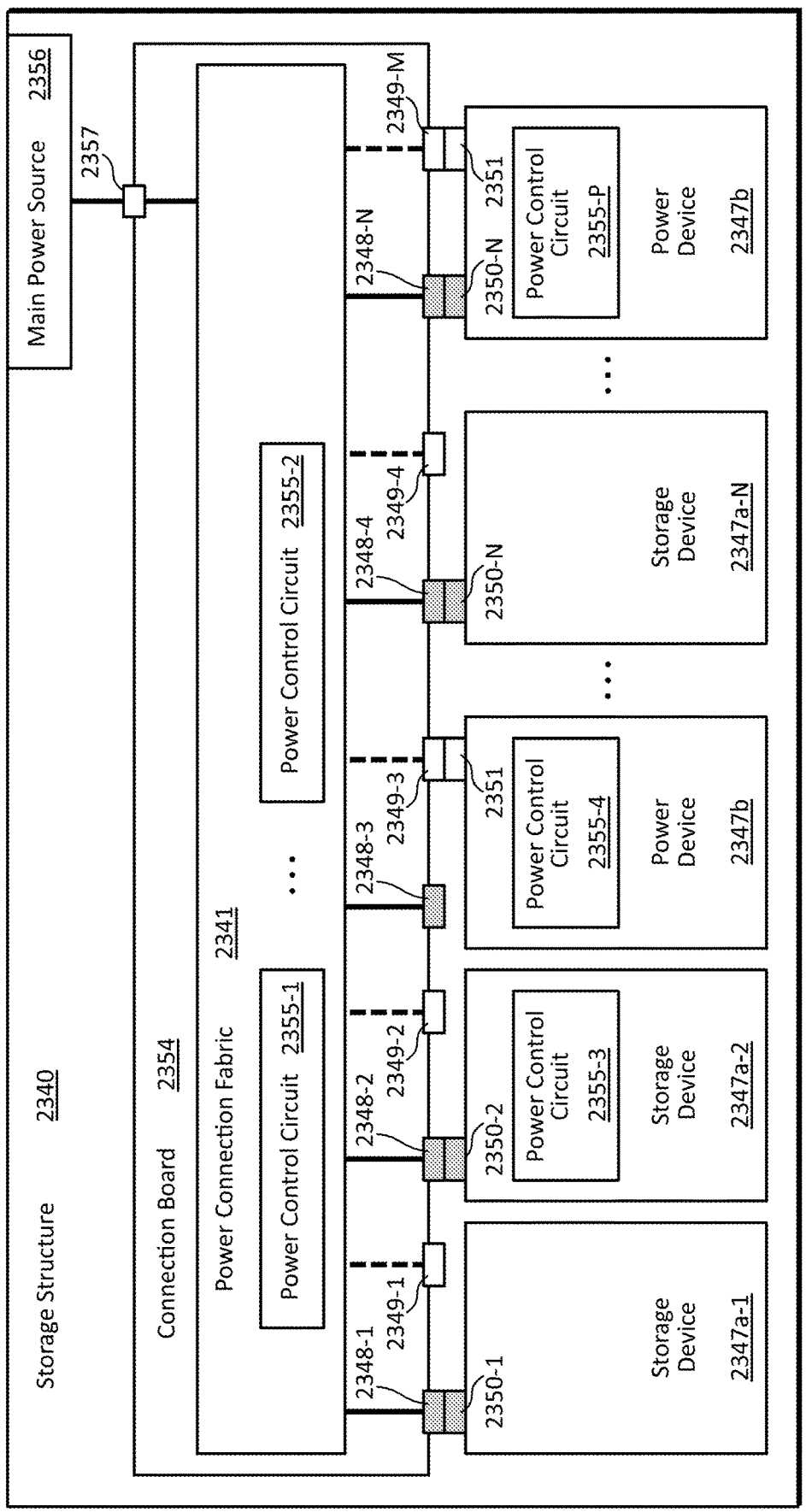
FIG. 23 illustrates an example embodiment of storage system having an eighth configuration in accordance with example embodiments of the disclosure.

FIG. 23 illustrates an example embodiment of storage system having an eighth configuration in accordance with example embodiments of the disclosure. The embodiment illustrated in FIG. 23 may include some elements similar to those illustrated in FIG. 22 in which similar elements may have reference numbers ending in similar digits. However, in the embodiment illustrated in FIG. 23, one or more power control circuits 2355-1, . . . , 2355-P, or portions thereof, may be located at a power connection fabric 2341, one or more storage devices 2347a, and/or one or more power devices 2347b. In such an embodiment, one or more functions of the more power control circuits 2355 may be distributed between any of the power control circuits 2355 including charging a power device 2347b (e.g., using power from a main power source 2356 and/or from a storage device 2347a, and/or the like), monitoring a charge state of a power device 2347b, sending information about a charge state of a power device 2347b (e.g., to a storage system that may include a motherboard, CPU, BMC, and/or the like, to a storage device 2347a, and/or the like), and/or transferring power (e.g., backup power) from a power device 2347b to one or more storage devices 2347a.

Figure 24:
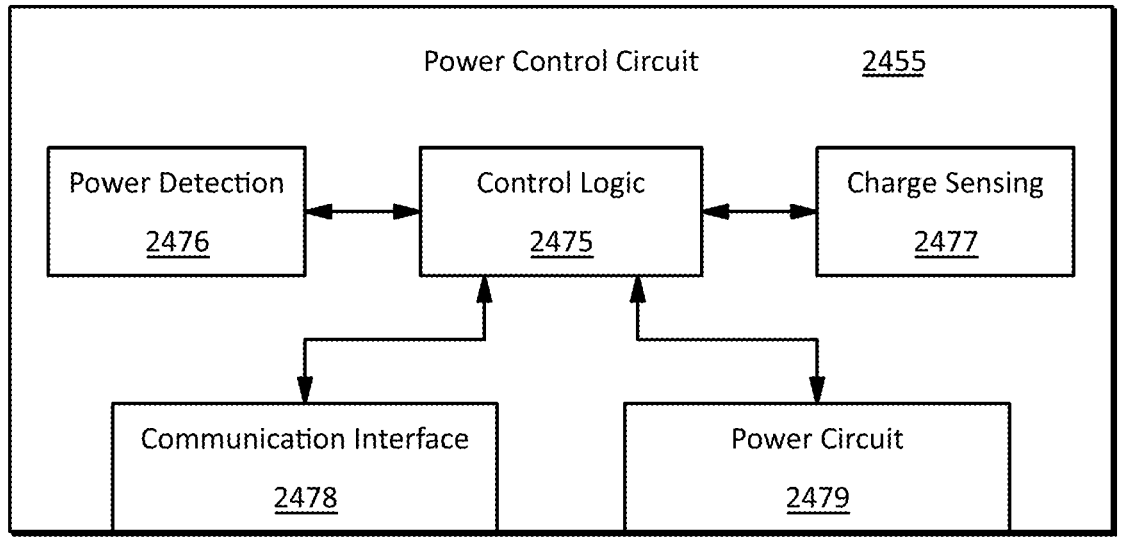
FIG. 24 illustrates an example embodiment of a power control circuit in accordance with example embodiments of the disclosure.

FIG. 24 illustrates an example embodiment of a power control circuit in accordance with example embodiments of the disclosure. The embodiment illustrated in FIG. 24 may be used, for example, to implement any of the embodiments of power control circuit disclosed herein.

The power control circuit 2455 illustrated in FIG. 24 may include control logic 2475, one or more power detection circuits 2476, one or more charge sensing circuits 2477, one or more communication interfaces 2478, and/or one or more power circuits 2479. The control logic 2475 may include logic functionality to control one or more functions, features, and/or the like, of the power control circuit 2455. The one or more power circuits may include power handling components such as one or more switches, wires, cables, jumpers, switches, relays, trances on circuit boards, and/or the like, to enable the power control circuit 2455 to direct the flow of power to, from, between, and/or the like, components such as storage devices, power devices, main power sources, power connection fabrics, and/or the like.

The one or more power detection circuits 2476 may sense the presence of power, for example, from a main power source to enable the control logic 2475 to determine whether to provide power (e.g., using one or more power circuits 2479) to one or more storage devices from a main power supply (e.g., as normal power) or from one or more power devices (e.g., as backup power).

The one or more charge sensing circuits 2477 may sense one or more physical characteristics of one or more power devices, for example, by sensing a charge voltage, a charge current, a device temperature, and/or the like, to enable the control logic 2475 to determine a charge state of a power device. In some embodiments, the one or more charge sensing circuits 2477 may be connected to one or more power devices, for example, using one or more connectors that may be used to connect the power device to a power connection fabric (e.g., a power connector such as a USB connector, a SATA power connector, an IDE power connector, and/or the like), one or more dedicated sense connections, and/or the like.

The one or more communication interfaces 2478 may enable the control logic 2475 to communicate with one or more systems (which may include, for example, a motherboard, a BMC, a CPU, and/or the like), one or more storage devices (e.g., a storage device in which it is located, an external storage device, and/or a combination thereof), one or more power devices, and/or the like. For example, control logic 2475 may use the one or more communication interfaces 2478 to transmit information about a charge state of a power device.

Figure 25:
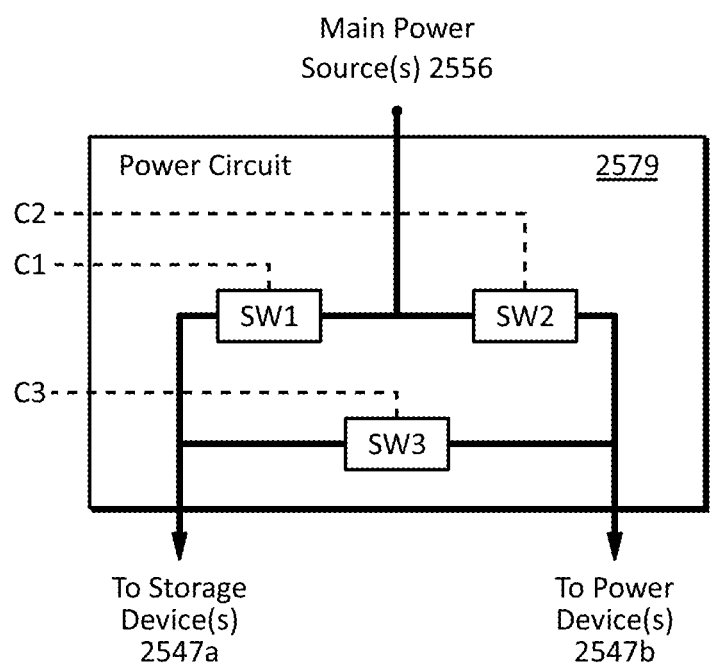
FIG. 25 illustrates an example embodiment of a power circuit in accordance with example embodiments of the disclosure.

FIG. 25 illustrates an example embodiment of a power circuit in accordance with example embodiments of the disclosure. The embodiment illustrated in FIG. 25 may be used, for example, to implement one of the one or more power circuits 2479 illustrated in FIG. 24.

For purposes of illustration, the embodiment illustrated in FIG. 25 may be used to with an embodiment of a power control circuit 2455 illustrated in FIG. 24 that may be used to implement the power control circuit 1455 illustrated in FIG. 14. Other embodiments, however, may be arranged in unlimited other configurations to implement any of the power control circuits disclosed herein.

Referring to FIG. 25, the power circuit 2579 may include a first switch SW1 that may be controlled by a first control signal C1, a second switch SW2 that may be controlled by a second control signal C2, and/or a third switch SW3 that may be controlled by a third control signal C3. The control signals C1, C2, and/or C3 may be generated, for example, by control logic such as control logic 2475 illustrated in FIG. 24. The switches SW1, SW2, and/or SW3 may be implemented, for example, with electromechanical relays (e.g., sets of contacts), solid state relays (e.g., solid state switches), switching transistors, and/or the like.

During normal operation, the first switch SW1 may be closed to supply power from a main power supply 2556 to a storage device 2547a, the second switch SW2 may closed to supply power from the main power supply 2556 to a power device 2547b (e.g., to charge the power device 2547b), and the third switch SW3 may be open. In response to a power loss event, the first switch SW1 may be opened to disconnect the storage device 2547a from the main power supply 2556, the second switch may be opened to disconnect the power device 2547b from the main power supply 2556, and the third switch SW3 may be closed to provide backup power from the power device 2547b to the storage device 2547a.

In some embodiments, and depending on the implementation details, one or more of the embodiments disclosed herein may enable a storage system to use one or more storage devices as persistent memory in a manner that may provide data consistency (e.g., guarantee data consistency). In some embodiments, and depending on the implementation details, one or more of the embodiments disclosed herein may enable a storage system to use one or more storage devices as persistent memory in a manner that may facility changing (e.g., expanding and/or reducing) the memory capacity of the system. Some embodiments, and depending on the implementation details may reduce the cost associated with using one or more storage devices as persistent memory.

Any of the embodiments disclosed herein may implement a flush complete with software (e.g., messaging using a protocol such as NVMe, CXL, and/or the like), hardware (e.g., implementing a flush compete signal using an RFU pin of a storage device connector), a system management scheme (e.g., SMBus), and/or any other scheme or combination thereof.

Any of the storage devices, storage media, and/or the like, disclosed herein may be implemented with any type of nonvolatile storage media based on solid state media, magnetic media, optical media, and/or the like. For example, in some embodiments, a storage device may be implemented as an SSD based on not-AND (NAND) flash memory, persistent memory such as cross-gridded nonvolatile memory, memory with bulk resistance change, phase change memory (PCM), and/or the like, or any combination thereof.

Any of the storage, power, and/or other devices disclosed herein may be implemented in any form factor such as 3.5 inch, 2.5 inch, 1.8 inch, M.2, Enterprise and Data Center Standard Form Factor (EDSFF), NF1, and/or the like, using any connector configuration such as Serial ATA (SATA), Small Computer System Interface (SCSI), Serial Attached SCSI (SAS), U.2, and/or the like.

Any of the storage, power and/or other devices disclosed herein may be implemented entirely or partially with, and/or used in connection with, a server chassis, server rack, dataroom, datacenter, edge datacenter, mobile edge datacenter, and/or any combinations thereof.

Any of the storage structures disclosed herein may be implemented with any component or combination of components such as a compute server, a storage server, a network server, a cloud server, and/or the like, a node such as a storage node, a computer such as a workstation, a personal computer, a tablet, a smartphone, and/or the like, or multiples and/or combinations thereof.

Any of the communication connections and/or communication interfaces disclosed herein may be implemented with one or more interconnects, one or more networks, a network of networks (e.g., the internet), and/or the like, or a combination thereof, using any type of interface and/or protocol. Examples may include Peripheral Component Interconnect Express (PCIe), NVMe, NVMe-over-fabric (NVMe-oF), Ethernet, Transmission Control Protocol/Internet Protocol (TCP/IP), Direct Memory Access (DMA)

Remote DMA (RDMA), RDMA over Converged Ethernet (ROCE), FibreChannel, InfiniBand, Serial ATA (SATA), Small Computer Systems Interface (SCSI), Serial Attached SCSI (SAS), iWARP, Compute Express Link (CXL), and/or a coherent protocol such as CXL.mem, CXL.cache, CXL.IO and/or the like, Gen-Z, Open Coherent Accelerator Processor Interface (OpenCAPI), Cache Coherent Interconnect for Accelerators (CCIX), and/or the like, Advanced extensible Interface (AXI), any generation of wireless network including 2G, 3G, 4G, 5G, 6G, and/or the like, any generation of Wi-Fi, Bluetooth, near-field communication (NFC), and/or the like, or any combination thereof.

Any of the functionality described herein, including any of the system functionality, storage device functionally, power control circuit functionality, and/or the like (e.g., any of the controllers, logic, and/or the like) may be implemented with hardware, software, firmware, or any combination thereof including, for example, hardware and/or software combinational logic, sequential logic, timers, counters, registers, state machines, volatile memories such DRAM and/or SRAM, nonvolatile memory including flash memory, persistent memory such as cross-gridded nonvolatile memory, memory with bulk resistance change, PCM, and/or the like and/or any combination thereof, complex programmable logic devices (CPLDs), field programmable gate arrays (FPGAs), application specific circuits (ASICs), central processing units (CPUs) including CISC processors such as x86 processors and/or RISC processors such as ARM processors, graphics processing units (GPUs), neural processing units (NPUs), tensor processing units (TPUs), and/or the like, executing instructions stored in any type of memory. In some embodiments, one or more components may be implemented as a system-on-chip (SOC).

In embodiments implemented at least partially with a storage device having a flash translation layer (FTL) any of the functionality described herein may be implemented at least partially with an FTL.

Figure 26:
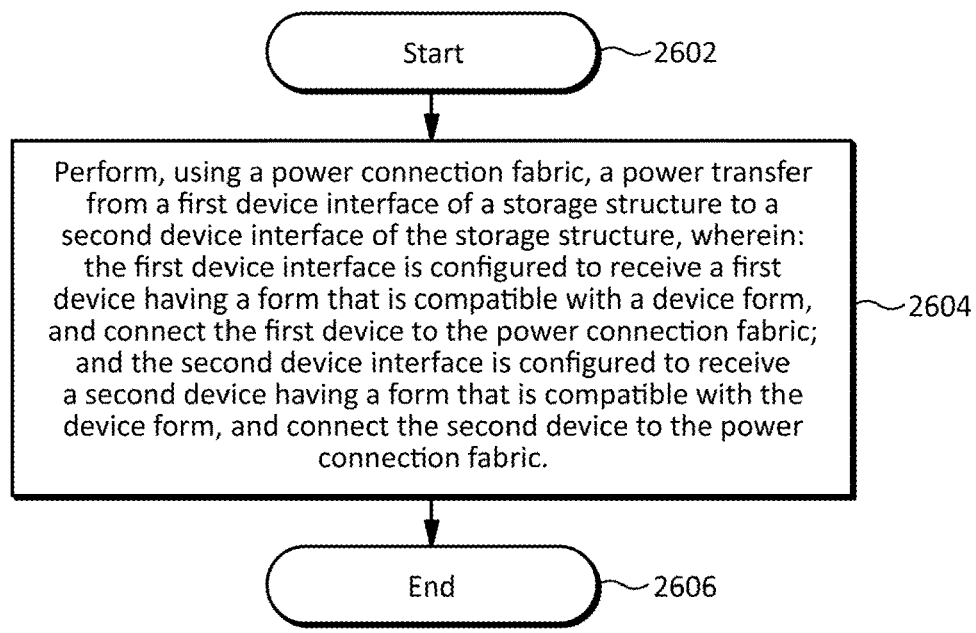
FIG. 26 illustrates a first embodiment of a method for providing power to a storage device in accordance with example embodiments of the disclosure.

FIG. 26 illustrates a first embodiment of a method for providing power to a storage device in accordance with example embodiments of the disclosure. The method may begin at operation 2602. At operation 2604, the method may perform, using a power connection fabric, a power transfer from a first device interface of a storage structure to a second device interface of the storage structure. The first device interface may be configured to receive a first device having a form that is compatible with a device form, and connect the first device to the power connection fabric. For example, the first device may be implemented as a storage device such as device 547-2 illustrated in FIG. 5, and the power connection fabric may be implemented on a connection board as the midplane 504 illustrated in FIG. 5. The second device interface may be configured to receive a second device having a form that is compatible with the device form, and connect the second device to the power connection fabric. For example, the second device may be implemented as a power device such as device 547-4 illustrated in FIG. 5. The method may end at operation 2606.

Figure 27:
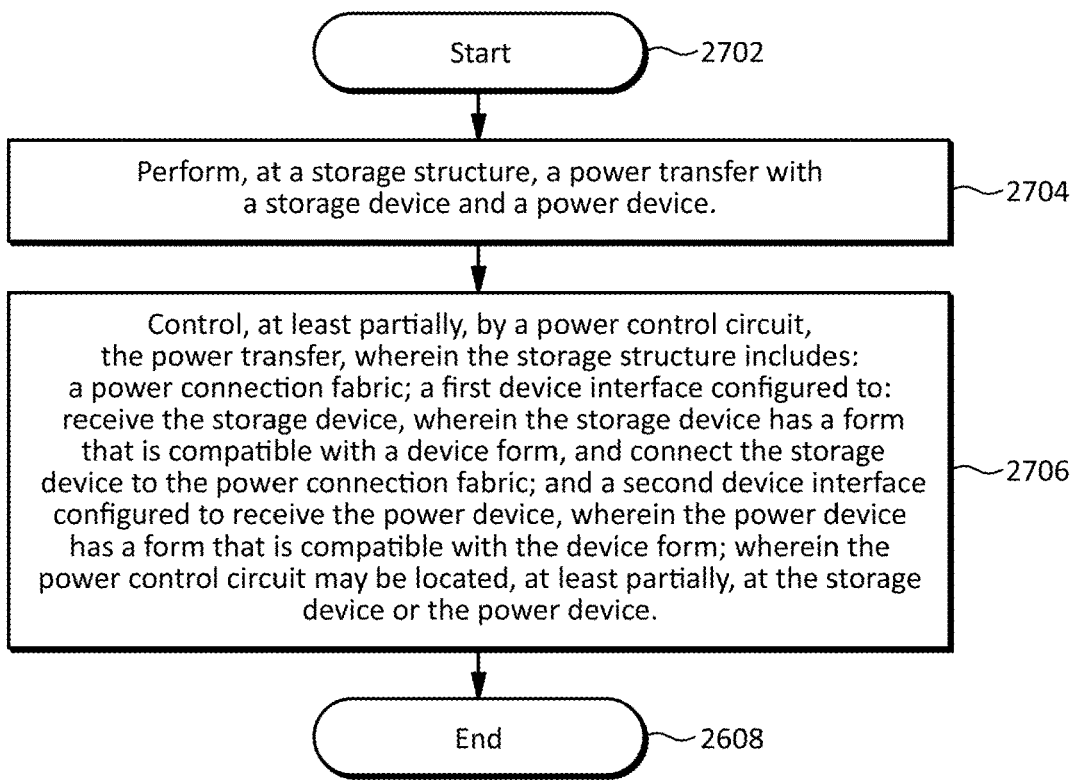
FIG. 27 illustrates a second embodiment of a method for providing power to a storage device in accordance with example embodiments of the disclosure.

FIG. 27 illustrates a second embodiment of a method for providing power to a storage device in accordance with example embodiments of the disclosure. The method may begin at operation 2702. At operation 2704, the method may perform, at a storage structure, a power transfer with a storage device and a power device. For example, the method may transfer power (e.g., backup power) from the power device 1047b to the storage device 1047a illustrated in FIG. 10. At operation 2706, the method may control, at least partially, by a power control circuit, the power transfer. For example, the power control circuit 1055 illustrated in FIG. 10 may control the transfer of power (e.g., backup power) from the power device 1047b to the storage device 1047a as illustrated in FIG. 10. The storage structure may include a power connection fabric such as power connection fabric 441 illustrated in FIG. 4.

The storage structure may include a first device interface (such as device interface 442 illustrated in FIG. 4) configured to receive the storage device, wherein the storage device may have a form that is compatible with a device form (such as device form factor 444 illustrated in FIG. 4) and connect the storage device to the power connection fabric. The storage structure may also include a second device interface (such as device interface 443 illustrated in FIG. 4) configured to receive the power device, wherein the power device may have a form (such as device form factor 445 illustrated in FIG. 4) that is compatible with the device form.

The power control circuit may be located, at least partially, at the storage device or the power device. For example, a power control circuit such as power control circuit 1655 may be located at least partially at a storage device 1647a as illustrated in FIG. 16. As another example, a power control circuit such as power control circuit 1955 may be located at least partially at a power device 1947b as illustrated in FIG. 19. The method may end at operation 2708.

The embodiments illustrated in FIG. 26 and FIG. 27 as well as all of the other embodiments described herein, are example operations and/or components. In some embodiments, some operations and/or components may be omitted and/or other operations and/or components may be included. Moreover, in some embodiments, the temporal and/or spatial order of the operations and/or components may be varied. Although some components and/or operations may be illustrated as individual components, in some embodiments, some components and/or operations shown separately may be integrated into single components and/or operations, and/or some components and/or operations shown as single components and/or operations may be implemented with multiple components and/or operations.

Some embodiments disclosed above have been described in the context of various implementation details, but the principles of this disclosure are not limited to these or any other specific details. For example, some functionality has been described as being implemented by certain components, but in other embodiments, the functionality may be distributed between different systems and components in different locations and having various user interfaces. Certain embodiments have been described as having specific processes, operations, etc., but these terms also encompass embodiments in which a specific process, operation, etc. may be implemented with multiple processes, operations, etc., or in which multiple processes, operations, etc. may be integrated into a single process, step, etc. A reference to a component or element may refer to only a portion of the component or element. For example, a reference to a block may refer to the entire block or one or more subblocks. A reference to a component or element may refer to one or more of the component or element, and a reference to plural components or elements may refer to a single component or element. For example, a reference to a resource may refer to one more resources, and a reference to resources may refer to a single resource. The use of terms such as "first" and "second" in this disclosure and the claims may only be for purposes of distinguishing the elements they modify and may not indicate any spatial or temporal order unless apparent otherwise from context. In some embodiments, a reference to an element may refer to at least a portion of the element, for example, "based on" may refer to "based at least in part on," and/or the like. A reference to a first element may not imply the existence of a second element. The principles disclosed herein have independent utility and may be embodied individually, and not every embodiment may utilize every principle. However, the principles may also be embodied in various combinations, some of which may amplify the benefits of the individual principles in a synergistic manner. The various details and embodiments described above may be combined to produce additional embodiments according to the inventive principles of this patent disclosure.

Since the inventive principles of this patent disclosure may be modified in arrangement and detail without departing from the inventive concepts, such changes and modifications are considered to fall within the scope of the following claims.

The invention claimed is:

1. An apparatus comprising:
a storage structure comprising:
a power connection fabric;
a first device interface configured to:
receive a first device having a form that is compatible with a device form; and
connect the first device to the power connection fabric; and
a second device interface configured to:
receive a second device having a form that is compatible with the device form; and
connect the second device to the power connection fabric;
wherein the power connection fabric is configured to disconnect the first device and the second device from a power supply and transfer power between the first device and the second device using a set of switches controlled by a logic circuit.

2. The apparatus of claim 1, wherein:
the first device comprises a storage device; and
the second device comprises a power device.

3. The apparatus of claim 2, wherein:
the first device interface comprises:
a first connector to connect the storage device to the power connection fabric; and
a first device slot to receive the storage device; and
the second device interface comprises:
a second connector to connect the power device to the power connection fabric;
and
a second device slot to receive the power device.

4. The apparatus of claim 2, wherein the first device interface is configured to:
receive the power device; and
connect the power device to the power connection fabric.

5. The apparatus of claim 4, wherein the first device interface comprises:
a first connector to connect the storage device to the power connection fabric; and
a second connector to connect the power device to the power connection fabric.

6. The apparatus of claim 2, wherein the storage structure further comprises a power control circuit to control, at least partially, a power transfer using the power connection fabric.

7. The apparatus of claim 6, wherein the power transfer comprises a power transfer from the second device interface to the first device interface.

8. The apparatus of claim 7, wherein the power control circuit is configured to control, at least partially, based on a power status, the power transfer from the second device interface to the first device interface.

9. The apparatus of claim 6, wherein the power transfer comprises a power transfer to the second device interface.

10. The apparatus of claim 9, wherein the power control circuit is configured to control, at least partially, using the power transfer to the second device interface, a charging of a power device connected to the second device interface.

11. The apparatus of claim 6, wherein the power control circuit is configured to monitor a charge state of a power device connected to the second device interface.

12. The apparatus of claim 6, wherein the power control circuit is configured to send information about a charge state of a power device connected to the second device interface.

13. The apparatus of claim 6, wherein the power connection fabric comprises:
a first connection connected to the power control circuit and a first connector of the first device interface; and
a second connection connected to the power control circuit and a second connector of the second device interface.

14. The apparatus of claim 13, wherein the first connection is connected to a third connector of a third device interface, wherein the third device interface is configured to receive a device having a form that is compatible with the device form.

15. The apparatus of claim 13, wherein the power connection fabric comprises a third connection connected to the power control circuit and a power source.

16. An apparatus comprising:
a power device comprising:
an interface to connect the power device to a storage system; and
a power source to provide to a storage device;
wherein at least a portion of the power device has a storage device form, and
wherein the power device and the storage device are disconnected from a power supply and power is transferred between the power device and the storage device based on a set of switches controlled by a logic circuit.

17. The apparatus of claim 16, wherein the power device is configured to provide power to the storage device using the interface.

18. The apparatus of claim 16, wherein:
the interface is a first interface; and
the power device comprises a second interface configured to provide power to the storage device.

19. A method comprising:
performing, using a power connection fabric, a power transfer from a first device interface of a storage structure to a second device interface of the storage structure;
wherein:
the first device interface is configured to:
receive a first device having a form that is compatible with a device form; and
connect the first device to the power connection fabric; and
the second device interface is configured to:
receive a second device having a form that is compatible with the device form;
and
connect the second device to the power connection fabric, and
wherein performing comprises disconnecting the first device and the second device from a power supply and performing the power transfer between the first device and the second device using a set of switches controlled by a logic circuit.

20. The method of claim 19, wherein:
the first device comprises a power device; and
the second device comprises a storage device.

* * * * *